(12) United States Patent
Labrie et al.

(10) Patent No.: US 8,983,806 B2
(45) Date of Patent: Mar. 17, 2015

(54) METHOD AND SYSTEM FOR ROOF ANALYSIS

(75) Inventors: Zachary Labrie, Broomfield, CO (US); Benjamin Zamora, Arvada, CO (US); Tim Bruffey, Commerce City, CO (US)

(73) Assignee: Accurence, Inc., Westminster, CO (US)

( * ) Notice: Subject to any disclaimer, the term of this patent is extended or adjusted under 35 U.S.C. 154(b) by 427 days.

(21) Appl. No.: 13/336,559

(22) Filed: Dec. 23, 2011

(65) Prior Publication Data

US 2012/0179431 A1    Jul. 12, 2012

Related U.S. Application Data

(60) Provisional application No. 61/460,964, filed on Jan. 11, 2011.

(51) Int. Cl.
*G06F 17/50*    (2006.01)

(52) U.S. Cl.
CPC ............ *G06F 17/5004* (2013.01); *G06F 17/50* (2013.01)
USPC .......................................................... 703/1

(58) Field of Classification Search
CPC .............................. G06F 17/50; G06F 17/5004
USPC .......................................................... 703/1
See application file for complete search history.

(56) References Cited

U.S. PATENT DOCUMENTS

| | | | | |
|---|---|---|---|---|
| 6,037,945 A * | 3/2000 | Loveland | | 345/420 |
| 6,810,383 B1 * | 10/2004 | Loveland | | 705/7.13 |
| 6,816,819 B1 * | 11/2004 | Loveland | | 703/1 |
| 6,826,539 B2 * | 11/2004 | Loveland | | 705/4 |
| 6,829,584 B2 * | 12/2004 | Loveland | | 705/7.11 |
| 8,078,436 B2 * | 12/2011 | Pershing et al. | | 703/2 |
| 8,145,578 B2 * | 3/2012 | Pershing et al. | | 705/400 |
| 8,170,840 B2 * | 5/2012 | Pershing | | 703/1 |
| 8,209,152 B2 * | 6/2012 | Pershing | | 703/1 |
| 8,401,222 B2 * | 3/2013 | Thornberry et al. | | 382/100 |
| 8,670,961 B2 * | 3/2014 | Pershing et al. | | 703/2 |
| 2009/0216552 A1 * | 8/2009 | Watrous | | 705/1 |

* cited by examiner

*Primary Examiner* — Aniss Chad
(74) *Attorney, Agent, or Firm* — Cooley LLP

(57) ABSTRACT

A system and method for intelligently combining CAD, inspection, and building guideline data for intelligently setting roof facet directionality, analyzing repair and replacement decisions and estimating material and repair or replacement costs for building facets is described. One embodiment includes receiving digital building facet data for a first building facet of a set of one or more building facets; receiving digital inspection data for the first building facet; determining the amount of building material required to repair damage to an area of the first building facet; determining a repair indicator for the first building facet; wherein the determining a repair indicator is based at least in part upon the digital facet data for the first building facet and the inspection data for the first building facet; and displaying an electronic image of the set of one or more building facets.

23 Claims, 17 Drawing Sheets

US 8,983,806 B2

METHOD AND SYSTEM FOR ROOF ANALYSIS

CROSS REFERENCE TO RELATED APPLICATIONS

The present application claims priority from commonly owned provisional application No. 61/460,964, entitled "Method and System for Roof Analysis" which is incorporated herein by reference in its entirety for all purposes.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates to methods and systems for building facet analysis. In particular, but not by way of limitation, the present invention relates to systems and methods for intelligently setting building facet directionality and estimating a quantity of building material with waste associated with a building facet repair, replacement, or both. Additionally, it relates to systems and methods for using aerial CAD data, insurance and building code guidelines, weather data, and inspection data for intelligently making repair decisions for building facets.

BACKGROUND OF THE INVENTION

In the homeowner's insurance industry, carriers face costly exposure to inaccurate payments, lawsuits, reduced business, and lost shareholder value due, in part, to adjusters' inconsistent and inaccurate methods of inspection, data gathering, and reporting. Furthermore, carriers miss significant opportunities to collect statistical and quantitative analytics that provide effective cost controls and much needed intelligence.

Estimating software products, such as Xactware, MSB, Symbility, and the like, have roof sketching tools that enable users to draw a roof themselves. However, these tools have limited functionality. Aerial CAD companies, such as Eagle-View, Precigeo, Geoestimator, and the like, can provide information about roof facet line types and roof facet directionality. Using either of these current types of tools, a user must determine, based on the limited information available, which roof facets and roof facet lines to replace. Using the limited, and often inaccurate data, the user must also determine the roof facet area quantities and roof facet line quantities that to replace. Furthermore, users make decisions about whether to replace or repair each roof facet or line based on the limited and often inaccurate data. Some current tools make use of inspection data input by a user to assist in the analysis. However, again that data can be suspect because it is subject to the user's interpretation and the interpretation is based on a limited quantity and quality of data.

For example, storms that cause wind and hail damage to buildings are directional. Therefore roof facets on the same roof have varying degrees of damage. This makes a repair vs. replace analysis and estimating repairs for a building subjected to directional storm difficult. Consequently, errors occur in estimating repair and replacement costs, the amount of materials required, and the amount of resulting waste material. More important, errors occur in determining whether fixing a facet or line requires a repair or replacement or whether it requires fixing at all. Pricing tools also exist to assist in determining labor and material costs for repair or replacement. Again, however, those tools have limited functionality and operate on incomplete or potentially inaccurate data.

In using existing tools, a user must select which roof facets to include in the roofing material installation. The user uses the individually calculated roof facet area quantities or the summed roof facet area quantities and adds a waste amount to the quantities after the fact. The waste amount that users add is meant to pay for the partial shingles that cannot be used in the installation and sometimes the ridge caps and starter strips. The added waste amount often ranges anywhere from eight to twenty-five percent. The waste amount is either a predetermined amount set by a guideline, for example an insurance guideline, or a user's judgment call based on the roof's structure or the material required.

Although present devices are functional, they are not sufficiently accurate or otherwise satisfactory. Accordingly, a system and method are needed to address the shortfalls of present technology and to provide other new and innovative features. What is needed is a system and method for combining available data for providing accurate repair vs. replacement analysis and material and cost estimation. In particular, a system and method is needed to scientifically calculate, based on disparate data sources and particular installation procedure requirements as described above, the actual amount of building material required for installation. Furthermore, a system or method is needed for intelligently deciding which building facets are in need of replacement or repair because current solutions based on disparate data sources such as inspection data, including weather data, insurance guidelines, and building codes.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide systems and methods for intelligently combining CAD, inspection, and building guideline data for intelligently setting roof facet directionality, analyzing repair and replacement decisions and estimating material and repair or replacement costs for building facets.

Onsite, an adjuster uses a smart paper form and digital pen to capture inspection data. In an exemplary embodiment, the digital inspection data from the adjuster is uploaded to an analysis engine which can validate and analyzes the data using predetermined business rules; enforce compliance with carrier guidelines and local rules; complete calculations; create a digital three-dimensional model of the property; prepare a scope of repair; and send information, for example, in an XML file, to an estimating vendor to automatically deliver a pre-qualified estimate to the adjuster. Because all of the necessary data and guidelines are integrated by the system and method, an estimate can be delivered approximately in real-time. For example, the estimate can be delivered within 90 seconds given a full set of predetermined rules and guidelines. In other embodiments, an estimate can be delivered approximately in real-time after user input to the analyses.

Exemplary systems and methods in accordance with the present invention can collect CAD data from aerial CAD providers and inspection data from the onsite user. Some examples of CAD data from aerial CAD providers included points, lines, line types, roof facet degrees, roof facet pitch, roof facet size, and the like. Some examples of inspection data include hail hit frequency, wind damaged data, building material, building material type, building material age, and the like.

Building material type can include the type of building material that comprises the building facet or building facet line, for example shingle, siding, decking, shield, drywall, insulation, and the like. Building material type can also include other information concerning a building facet or building facet line, for example, whether the building material type is exposed, partially exposed, exterior, interior, layered, and the like. Building material can include the material of which the facet components are built, for example wood shingle, asphalt shingle, clay roof tiles, metal gutter, fiberglass gutter, gypsym drywall, vinyl siding, aluminum siding, wood siding, and the like. Embodiments can accommodate multiple building materials and building material types. Further, some embodiments can enable user input building material and building material types to further refine the repair indicator decisions.

Some embodiments can use both types of data, along with others such as regional, local, or other insurance guidelines and local or other building codes, to make a replacement or repair decision for each building facet. Further, exemplary systems and methods in accordance with the present invention can assign to each building facet a resulting replacement decision. Exemplary systems and method in accordance with the present invention can determine the amount of building material required for each building facet based on the size of the material, installation requirements, rules, and guidelines, and building facet characteristics. Some embodiments can adjust the area of building material installation to match the installation requirements, rules, and guidelines. In some embodiments, a building material pattern is created and a building facet is superimposed on it to identify the building materials needed for installation. Wholly- and partially-used building materials are identified, and partially-used roofing materials are reused on other building facets. Actual building material use and waste are calculated. Exemplary systems and methods in accordance with the present invention can be configured to handle variable aspects of roofing material installation including roofing material types, processes, rules, partial building materials, and building material waste.

In one exemplary embodiment, the present invention can include a method for property repair analysis, comprising receiving digital building facet data for a first building facet of a set of one or more building facets; receiving digital inspection data for the first building facet; determining the amount of building material required to repair damage to an area of the first building facet; determining a repair indicator for the first building facet; wherein the determining a repair indicator is based at least in part upon the digital facet data for the first building facet and the inspection data for the first building facet; and displaying an electronic image of the set of one or more building facets.

The method may be implemented on a computer equipped with memory, processor, user interface peripheral devices including a display, storage media devices, and network communications interfaces. The invention also provides a digital storage medium tangibly embodying machine-readable instructions executable by a computer, where the instructions implement the method.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1A:
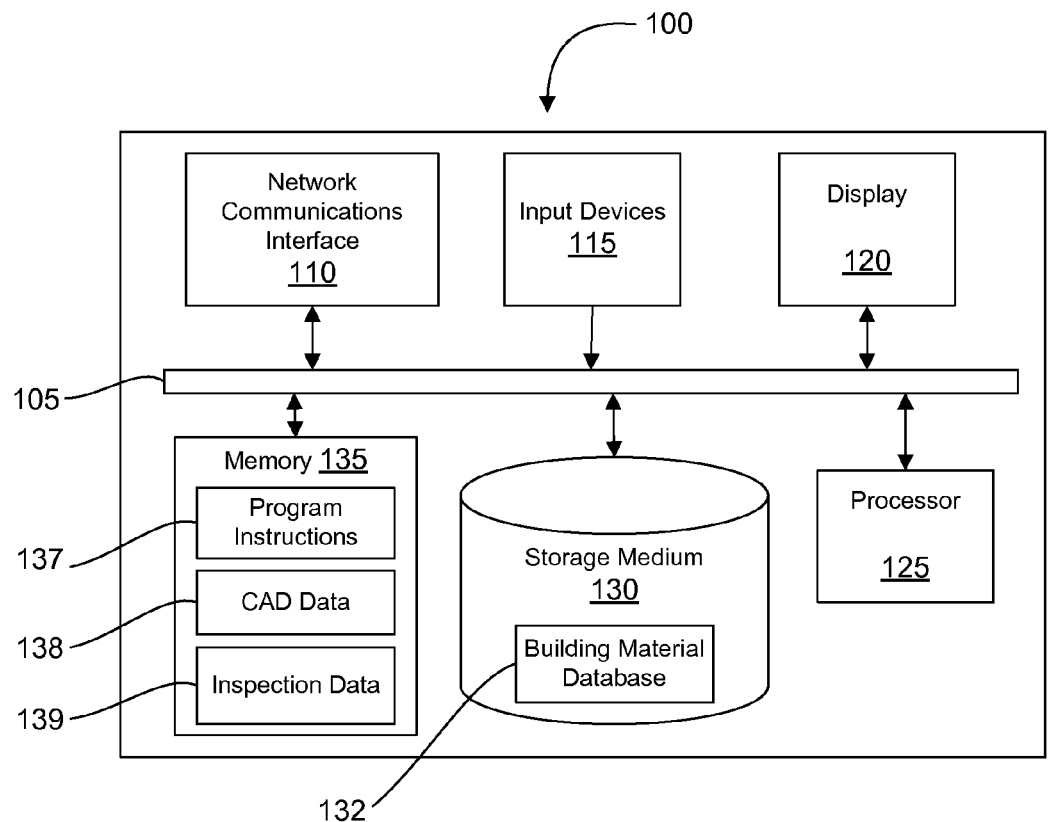
FIG. 1A shows a functional block diagram of a computer equipped with a building facet analysis application in accordance with an illustrative embodiment of the invention.

Referring now to the drawings, where like or similar elements are designated with identical reference numerals throughout the several views, and referring in particular to FIG. 1A, it illustrates a functional block diagram of a computer 100 in accordance with an illustrative embodiment of the invention. In FIG. 1A, processor 125 communicates over data bus 105 with input devices 115, display 120, network communications interface 110, storage medium 130, and memory 135. Though FIG. 1A shows only a single processor, multiple processors or a multi-core processor may be present in some embodiments. Input devices 115 include, for example, a keyboard, a mouse or other pointing device, or other devices that are used to input data or commands to computer system 100 to control its operation. Network communications interfaces 110 may include, for example various serial or parallel interfaces for communicating with a network or one or more peripherals.

Memory 135 may include, without limitation, random access memory (RAM), read-only memory (ROM), flash memory, magnetic storage (e.g., hard disk drive), optical storage, or a combination of these, depending on the particular embodiment. In FIG. 1A, memory 135 includes program instructions 137, which process CAD data 138 and inspection data 139.

In one illustrative embodiment, program instructions 137 are implemented as software that is executed by processor 125. Such software may be stored, prior to its being loaded into RAM for execution by processor 125, on any suitable computer-readable storage medium such as a hard disk drive, an optical disk, or a flash memory (see, e.g., storage medium 130). In general, the functionality of program instructions 137 may be implemented as software, firmware, hardware, or any combination or sub-combination thereof.

In the illustrative embodiment shown in FIG. 1A, network communications interface 110 can be used to receive CAD data 138 and inspection data 139. For example, CAD data 138 can be received from a provider of aerial CAD data. Similarly, network communications interface 110 can receive inspection data 139.

Figure 1B:
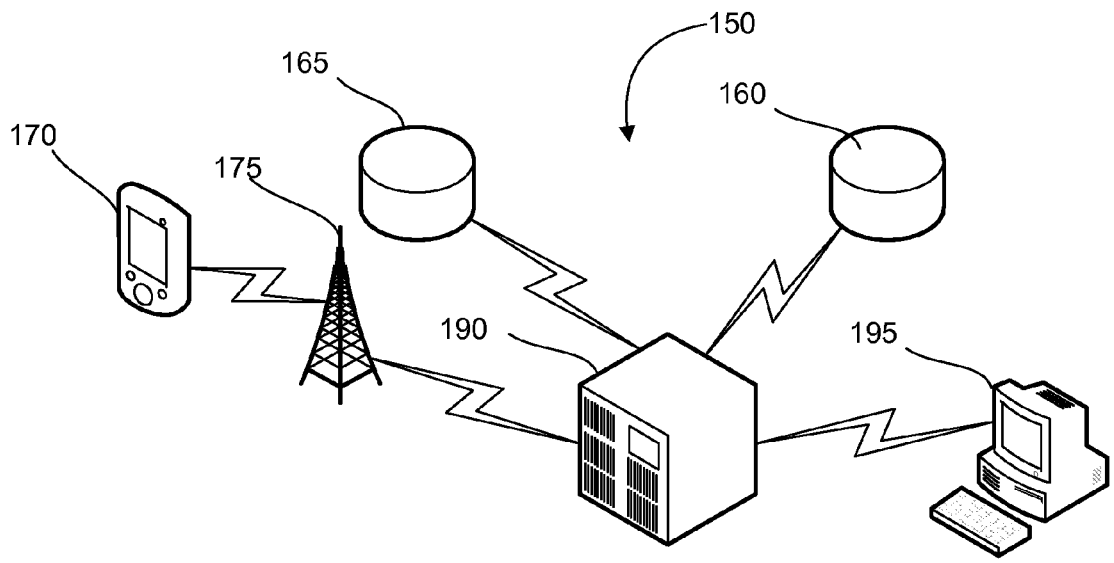
FIG. 1B shows a schematic of a network system implementing a building facet analysis application in accordance with an illustrative embodiment of the invention.

Referring now to FIG. 1B, it illustrates a system 150 in accordance with an exemplary embodiment of the invention. In FIG. 1B computer 195, which can be similar or identical to computer 100, communicates with a server 190 which receives digital building facet data from an aerial CAD provider database 160 and repair guideline data from a guideline database 165. Such repair guideline data can be provided by, for example, insurance carriers. Digital building facet data can be received from some other source that provides dimensional building facet data, directional building facet data, and other building facet data. In some embodiments, additional data sources can provide building facet data, guideline data, or both. Further, databases 160 and 165 and other data sources can be combined or further separated data sources from which data is received. Inspection data can be received via a communications network 175 from onsite inspection data captured by portable inspection device 170. Other data received by computer 195 can include building code requirements. Portable inspection device 170 can be a PDA, laptop, or other hardware configured to capture inspection data for transmission to server 190 and computer 195. In some embodiments, server 190 can be configured to receive inspection data from portable device 170.

In some embodiments, computer 195 can be a portable computer or device. For example, portable device 170 can implement the functions and structure of computer 195 necessary to embody a portion of an embodiment of the invention, including receiving data, for example from databases 160 and 165. Such a device can be useful so that estimations can be produced onsite at the inspection. Those of skill in the art can appreciate that computer 195 can be implemented as a laptop, tablet computer, PDA, smart phone, or other portable device or a personal computer, minicomputer, mainframe computer, or other non-portable device. Furthermore, some embodiments can include a computer 195 that receives data directly rather than through a server 190 or some other device. Likewise, in one embodiment, portable device 170 can communicate directly to computer 195.

Figure 2:
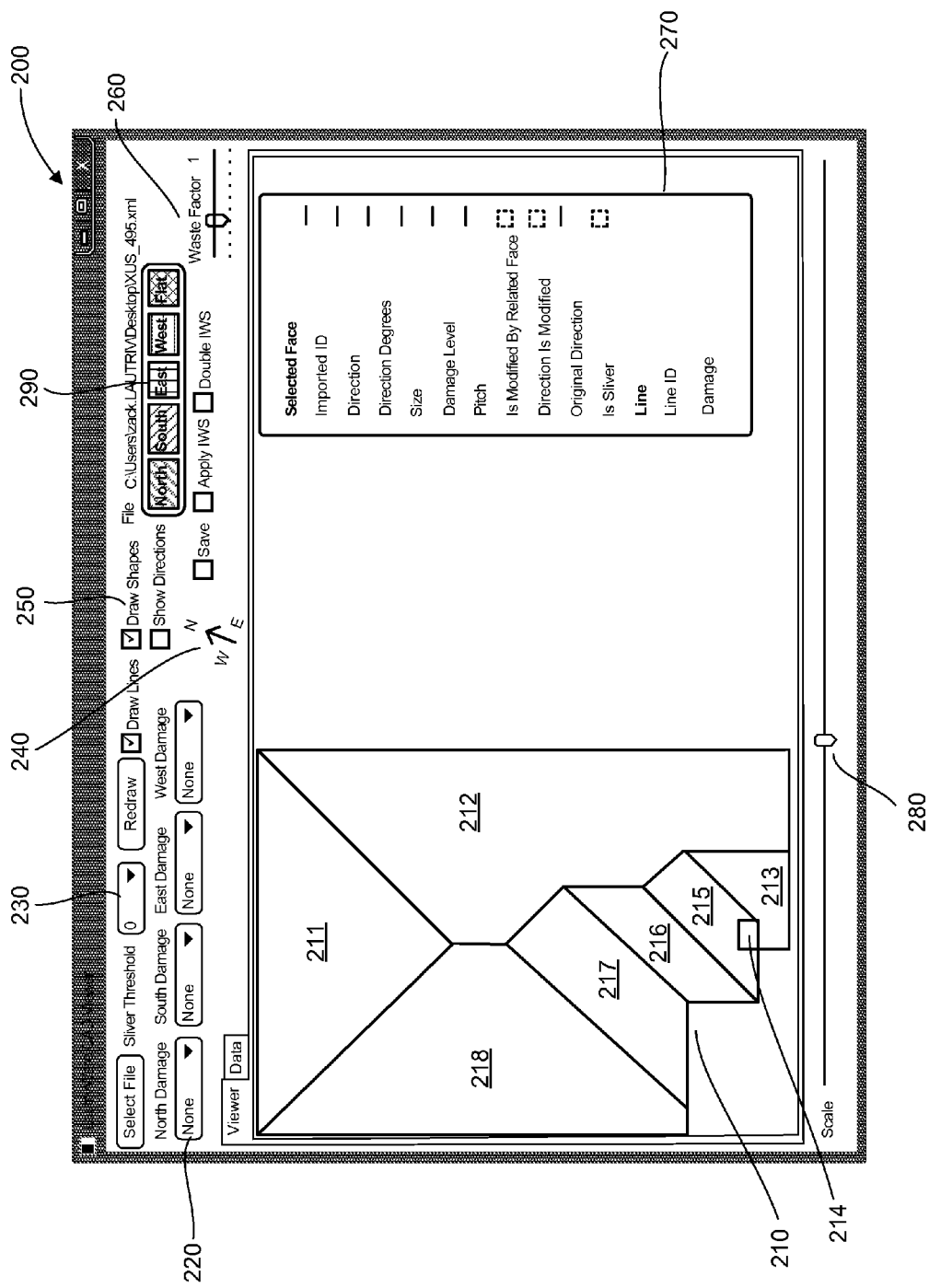
FIGS. 2-3 and 5-8 show exemplary versions of a computer-based application in accordance with embodiments of the invention.

Referring now to FIG. 2, it illustrates a portion of a system in accordance with an embodiment of the present invention. Shown is a computer-aided design (CAD) application 200 that can implement a portion of the system. The application 200 can be implemented on a computer system. The application 200 can display electronic CAD images or some other type of digitally rendered electronic images of building facets, in part, to enable repair decision or settings to be graphically depicted. It should be understood that images described herein and the data used to compile them can include CAD images and data or electronic images or digital data suitable for other digital rendering. In some embodiments, the CAD image 210 is constructed from aerial CAD data. Such aerial CAD data can be received from a CAD provider. The exemplary embodiment of FIG. 2 shows a roof CAD image 210 and its facets 211-218 of a particular building. The facet CAD image 210 can be projected into three-dimensional space.

Other embodiments may display CAD images in two-dimensional space. For example, each facet of the image can be displayed horizontally so that the view direction to each facet is normal to the plane of each facet. Further, facets other than the roof facets of CAD image 210 can be shown. For example, facets can include vertically- or horizontally-aligned facets or facets aligned at an angle. All of the facets of roof CAD image 210 shown in FIG. 2, for example, are angled except for facet portion 214. Facet portion 214 is part of facet 213 and sits under facet 215. Building facets specifically can include walls, doors, windows, gables, ridges, eaves, gutters, posts, patios, decks, dormer facets, chimney facets, and other faces or sections of a building. The invention can operate on CAD images for various types of buildings including, but not limited to, houses, sheds, garages, apartment buildings, condominiums, attached houses, and other residential type buildings. Further buildings can include office buildings, school buildings, agricultural buildings, industrial buildings, parking structures, religious buildings, shopping centers and malls, and other non-residential buildings. Those of skill in the art can appreciate that the present invention can be used to assess damage and determine repair requirements for any structure.

Returning to FIG. 2, an embodiment of the present invention can link building facets together using shared lines and shared points. Linking can be accomplished, for example as shown in FIG. 2, by displaying facets such that each facet is adjacent to each physically adjacent facet. In another embodiment linking can include displaying facets blown up (i.e., with gaps in between facets). Such a display can make clear the shape and relative size of each facet. For example two adjacent facets may face substantially the same direction. Separating the image of each facet can make clearer the physical separateness of the facets. Furthermore, where building facets include a different material for each of different portions of a facet, the facet can be separated into two more facets for display. Other methods of visually depicting different facets or different portions of a facet can be used, including lines, pattern coding, shade coding, color coding, and the like.

In some embodiments, directionality can be assigned to building facets 211-218. Directionality can be assigned to each facet 211-218 based on a threshold angle difference from normal to a compass direction. For example, in one embodiment, where a facet angle differs from a compass direction by anything from less than 90° to −90° can be assigned the directionality of that compass direction. In other embodiments, the threshold can be lower. In such embodiments, directionalities in addition to north, south, east, and west can be included to accommodate the smaller thresholds.

For example, north-west can be included where the threshold is anything from less the 45° to −45°. Other directionalities than those based on compass directions can be included. For example, directionality indicating that a facet is parallel to the ground surface or some other substantially horizontal surface can be included.

Figure 3:
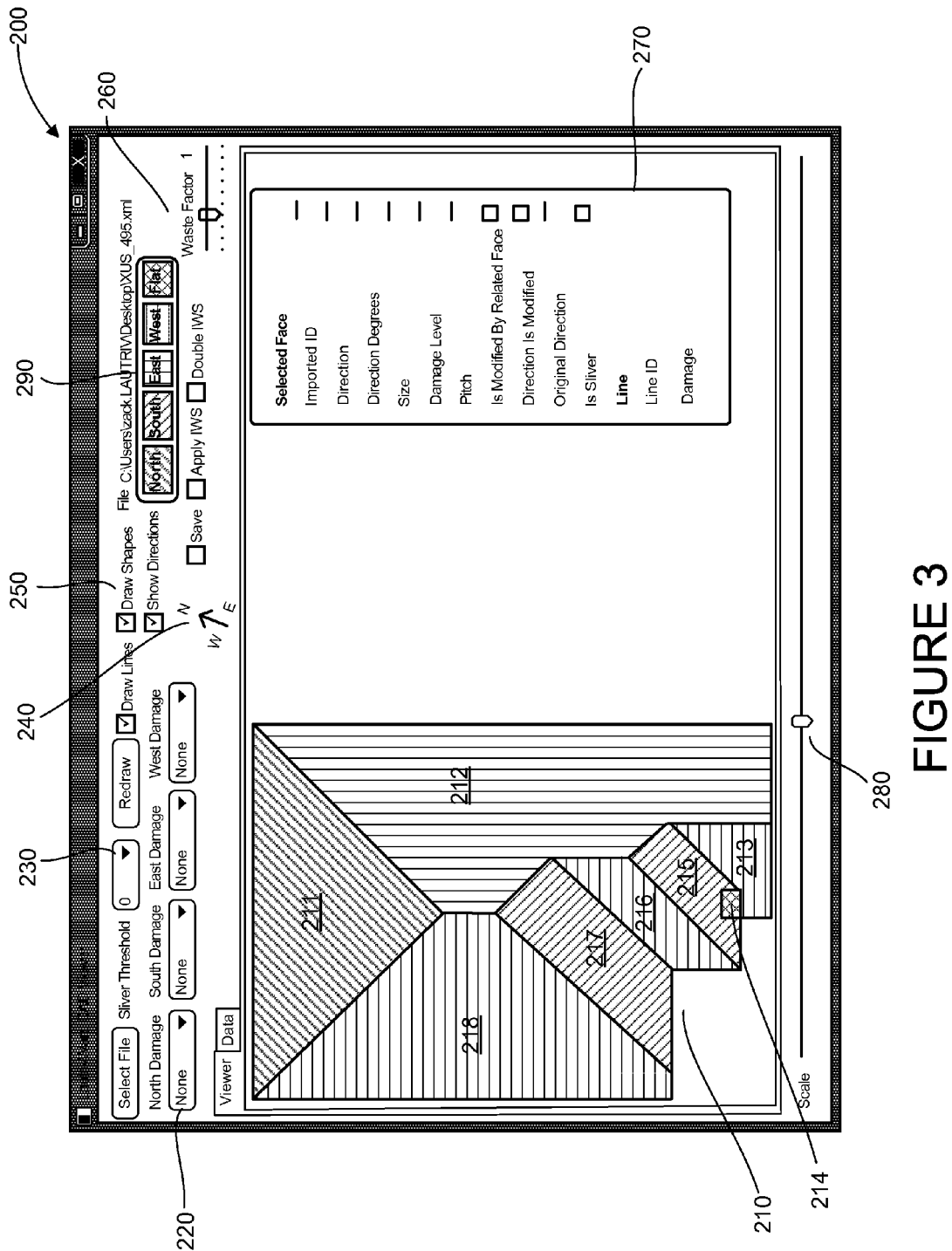

Referring now to FIG. 3, building facet CAD image 210 is coded to indicate the directionality of each roof facet 211-218. For example, each facet's directionality is illustrated using pattern coding. As can be seen, north-facing facet 211 has a forward-diagonal line pattern, east-facing facet 212 has a vertical line pattern, west-facing facets 213, including facet portion 214, 216, and 218 have a horizontal line pattern, south-facing facets 215 and 217 have a backward-diagonal line pattern, and any flat facets would have a cross-hatch pattern. In other embodiments coding of directionality can be accomplished by color-coding, number, letter, or word coding, shade coding, brightness coding, and the like.

In some embodiments, a system can include sliver detection. For example, in the exemplary systems illustrated in FIGS. 2 and 3 include a sliver threshold option 230. Using a sliver threshold, sliver detection can be performed in which a building facet size threshold for assigning additional directionality to a building facet can be set. A predetermined sliver threshold can be set or a sliver threshold can be set to particular values. In some embodiments, a primary building facet and each of that primary building facet's linked building facets, or secondary building facets, can be determined. If a secondary building facet has a direction assigned to it that is different than the direction assigned to the primary roof facet, the primary building facets directionality can be assigned to a secondary building facet. For example, in CAD image 410 of FIG. 4A, building facets 214, including facet portion 213, 216, and 218 of building CAD image 410 are all assigned the same directionality. In building CAD image 420 of FIG. 4B, building facet 215 may fall below a sliver threshold and because building facet 215 is linked to building facet 216 and building facet 216 has the same directionality as building facet 218, building facet 215 is assigned the same directionality. Furthermore, the area of building facet 217 does not fall below the sliver threshold. Consequently, even though building facet 217 is linked to building facet 218, its directionality is not re-assigned. The directionality assignment can depend on the size or area of the secondary building facet. In other embodiments, the assignment can depend on the relative size of the primary and secondary building facets, the shape of the primary or secondary building facet, and the relative offset from normal to the assigned directionality of either or both of the primary and secondary building facets. Those of skill in the art can appreciate the different types of relationships between the primary building facet and a secondary building facet that can be used to determine whether directionality should be assigned to a secondary building facet.

In some embodiments, directionality can be changed or reassigned to a building facet. For example, the directionality of a building facet can be set by a user. In other embodiments, the directionality of a building facet can be reassigned automatically according to some criteria other than a sliver threshold. For example, where a building facet is adjacent to other building facets on a predetermined number of sides or a predetermined length of the building facet's outline, the building facet's directionality can be reassigned to the directionality of the adjacent building facets.

Returning to FIG. 2, the CAD image of roof CAD image 210 and its facets 211-218 can be constructed from aerial CAD data. In some embodiments, CAD data is collected from aerial CAD providers. Some examples of CAD data include points, lines, line types, roof facet degrees, roof facet pitch, roof facet size, and the like.

Also shown in FIG. 2 is an information panel 270 to indicate information about a particular selected facet from facets 211-218. Information in information panel 270 can include, for example, information from the aerial CAD image for the selected facet, the direction the facet faces, the angle from normal relative to a direction, in degrees that the facet sits; a size of the facet, for example the area; the damage level, the pitch, or slope, of the facet; an indication of whether the building facet is modified in some way by a linked facet; whether the building facet's directionality has been reassigned; the building facet's original or actual directionality; the building facet's assigned directionality; the building facet's materials information, for example the building material or building material type; whether the building facet is considered a sliver, i.e., the building facet falls below a sliver threshold; whether the object is a line; identifier for the line; damage-related information; and repair indicator information, for example a code or text indicating the repair indicator for the building facet and whether the repair indicator is automatically set or set by a user.

Some embodiments can include a compass indicator 240 as part of the display. This can be useful to assist the user in understanding the offset angle of facets from their directionality. Embodiments can also include options 250 for displaying CAD features in the image. The exemplary embodiment of FIG. 2 includes "Draw Lines" "Draw Shapes," and "Show Directions." Others can include options for displaying the image in color or grayscale, displaying information panel 270 or other ancillary information, displaying a projected three-dimensional image or two-dimensional image, displaying linked or separated facets, and the like. Embodiments can include other, non-binary functions such as scale function 280. Other functions can include facet separation distance; facet line brightness, thickness, or other characteristic; facet brightness or some other characteristic based on damage severity or some other value. Those of skill in the art can appreciate the different options and functions available for display settings within a system that embodies the invention.

The embodiment shown in FIG. 2 includes facet direction repair indicators 220. In the exemplary embodiment of FIG. 2, facet direction repair indicators 220 includes settings for North, South, East, and West. Other embodiments can include settings for additional directions, for example, Flat, Northwest, Southeast, Northeast, Southwest, and the like. In yet other embodiments, facet repair indicators can be included for types of surfaces. For example, settings can include walls, windows, doors, or other types of facets. Further settings can include material or material type. In yet other embodiments combinations of the above can be used to indicate facet direction repair indicators 220. Repair indicators can include repair, replace, inspect, inspect further, or other action to be taken on the particular facet or facet type.

A repair indicator can be determined based on inspection data, weather data, building facet data, guideline data, and combinations thereof. For example, where a hail hit frequency is above a predetermined frequency, a building facet can be tagged with a "REPLACE" repair indicator rather than a "REPAIR" or some other repair indicator if the frequency is equal to or falls below the predetermined frequency. Likewise, if wind damage data indicates that wind speed rose above a predetermined threshold, for a predetermined amount of time, or a combination thereof, the repair indicator can be set to "REPLACE." Other weather data also can be used to determine the repair indicator. Weather data can be used in conjunction with directionality or other geometric building facet data (e.g., area, shape, etc.) and guideline data to further refine predetermined thresholds and set repair indicators.

Referring now to FIG. 3, portions of an exemplary system are shown. In some embodiments, decisions related to repairing, replacing, or taking other action can be made. Inspection data from an onsite roof inspector can be received. The inspection data can include data such as type of roofing material, hail hit frequency (e.g., number of hail hits), wind damage data (e.g., area of wind damage), and the like. Those of skill in the art can appreciate the different inspection-related data that can be used to enable a decision related to repairing, replacing, or taking some other action related to damage to a building facet. In some embodiments, inspection data can be applied to CAD data. Upon receiving inspection data, analysis related to whether to repair, replace, or take some other action can be performed for each directionality of the building facets. Each building facet can have other building facets linked to it that are identified for replacement, for repair, as not damaged, or by some other indicator depending on the analysis.

In some embodiments, CAD information, inspection data, or both can be used to make a repair, replacement, or other decisions for a building facet. Exemplary embodiments can use the directionality assigned to building facets and analysis decision for the directionality. A building facet can be tagged with a "REPAIR" repair indicator, "REPLACE" repair indicator, or some other repair indicator based on its assigned directionality, some other characteristic, or a combination of characteristics. If a building facet has more than one assigned directionality, more than one repair indicator, or both then a repair indicator with the highest priority can be used. For example, "REPLACE" may have priority over "REPAIR." Some exemplary systems can choose which building facets and building facet lines to replace, repair, or take some other action; which linked building facets and building facet lines to replace, repair, or take some other action; and aggregate the replace and repair quantities, reducing human error. This small facet can now act as either direction that it is tagged with. When portions of a roof are being replaced, some facets will have this multi-direction flexibility for being replaced. This flexibility is important for visual, logical, and installation purposes.

Each building facet has associated lines, for example eaves, rakes, valleys, ridges, pitch transition, flashing, step flashing, and the like. When a building facet is assigned for replacement, its associated lines may be assigned for replacement as well. This assignment can depend on line type, line size, line location, some other line characteristic, or a combination thereof. As discussed above, building facets can be coded, for example, color coded, to represent replacement, repair, not damaged, or some other indicator. A line can similarly be coded to represent the repair indicator assigned to the line.

In addition to reassigning directionality based on a sliver threshold, a repair indicator can also be set based on a sliver threshold. A sliver threshold for repair indicators can be based on a geometric value of the building facet, for example size, including the number of shingles or other material units for the particular facet or facet area; replacement cost of the building facet; replacement cost for the building facet's associated lines; repair cost of the building facet; repair cost for the building facet's associated lines; are a combination thereof. A repair indicator can be set for each building facet individually. If a building facet is set for replace, repair indicators can also be evaluated for building facets linked to that building facet. Criteria for evaluating the repair indicator for linked building facets can include the linked building facets current repair indicator, if there is one; the directionality of the linked building facet; the area or size of the linked building facets; cost to repair or replace the linked building facet; material type of the linked building facet, and the like. Those of skill in the art can appreciate the different inputs to a repair indicator that can be required.

As an example, a linked building facet that has a repair indicator of "REPAIR" or "NOT DAMAGED" can be analyzed to see if it meets the sliver threshold criteria for reassigning its repair indicator from "REPAIR" or "NOT DAMAGED" to "REPLACE." If the building facet does meet the replacement sliver threshold, then the building facet and its associated lines can be given a repair indicator of "REPLACE." That building facet's directionality can then be reassigned to the directionality of the linked building facet that triggered the replacement.

Some embodiments can include material tagging. For example, based on a building facet's surface area material, the building facet and facet lines can be tagged with material for installation in the event the building facet and/or facet lines are assigned a "REPLACE," "REPAIR," or other repair indicator indicating material replacement or repair or other setting which could result in material installation requirements. The type of materials that a building facet can be tagged with include exterior, exterior layer, interior, interior layer, and the like. For example, types of materials that a building facet can be tagged with include shingles, felt, decking, ice and water shield, additional shingle layers, siding, drywall, insulation, and the like. Material tagging, like repair decisions and directionality can be accomplished automatically by correlating inspection data or some other data to CAD image data. Further, it can be accomplished by coding a building facet using color coding, pattern coding, number coding, word or text coding, shade coding, brightness coding and the like.

Referring still to FIG. 3, a system can include building material and building material type options for a user to customize material tagging for one or more building facets. A building facet can be tagged with a "REPLACE" repair indicator and the system can provide options for assigning one or more building material types to the building facet. For example, building facet 215 can be automatically assigned a "REPAIR" repair indicator and automatically tagged with a building material of shingles. The system can provide the ability to tag the building facet 215 with a "REPLACE" repair indicator and building materials of shingles and water shield. Further, the installation procedures of some building materials require the installation of other, related building materials. As a result, tagging a building facet, either automatically or otherwise, with a particular building material or building material type can result in automatically tagging the building facet with one or more other building materials or building material types. For example, if building facet 215 is tagged with laminated shingles, building facet 215 can be automatically tagged with felt and decking building materials. In some embodiments, information related to the tagged building materials of a building facet can include information related to the installation requirements of the building materials. For example, the information related to the building materials with which building facet 215 is tagged can include information that the felt and decking should be installed under the shingles, in a certain manner, and the like. Those of skill in the art can readily appreciate the permutations of building material information with which a building facet can be tagged.

In some embodiments, building facet lines can also be tagged with directionality and repair indicators similar to building facets. As well, building facet lines can be assigned a line type, for example, hip, rake, eave, ridge, and the like.

Line type information can be displayed via information panel 270, using coding in a CAD image as discussed herein, or some other graphical depiction. Likewise, building facet lines can be tagged with building material settings. Building facet lines can be tagged with material types as well as specific materials. For example, building facet lines can be tagged with shingle starter strips, drip edge, gutter, gutter guard, soffit, siding trim, and the like. Other information can include the material which makes up the building material. For example, additional tagging can include wood shingle, asphalt shingle, metal gutter, fiberglass gutter, and the like.

Furthermore, where a building facet is tagged with building materials or building material types, a building facet line linked to the building facet can be automatically tagged with a building material or building material type based on the building material or building material type with which the building facet is tagged. For example, a building facet can be tagged with shingles. Because a shingle installation procedure recommends installation of a drip edge on eave and rake lines, any eave and rake building facet lines linked to the building facet can then be automatically tagged with a drip edge.

Figure 4A:
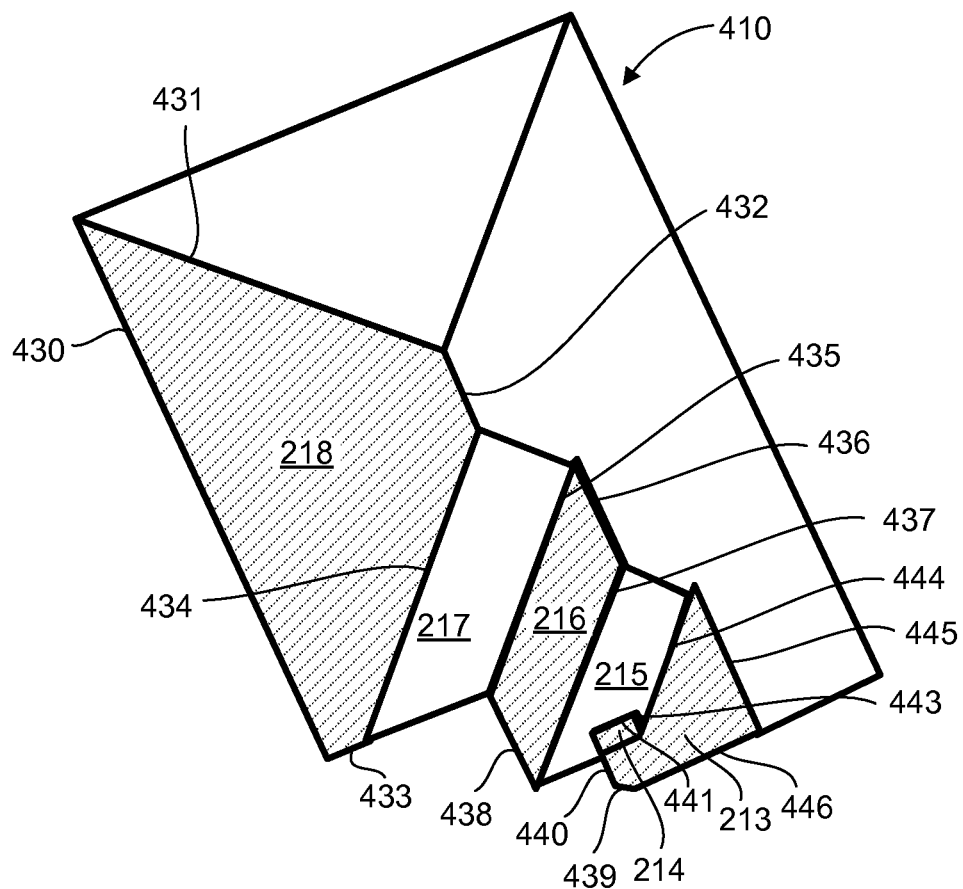
FIGS. 4A and 4B show CAD images of roof facets coded with repair indicators according to illustrative embodiments of the invention.
Figure 4B:
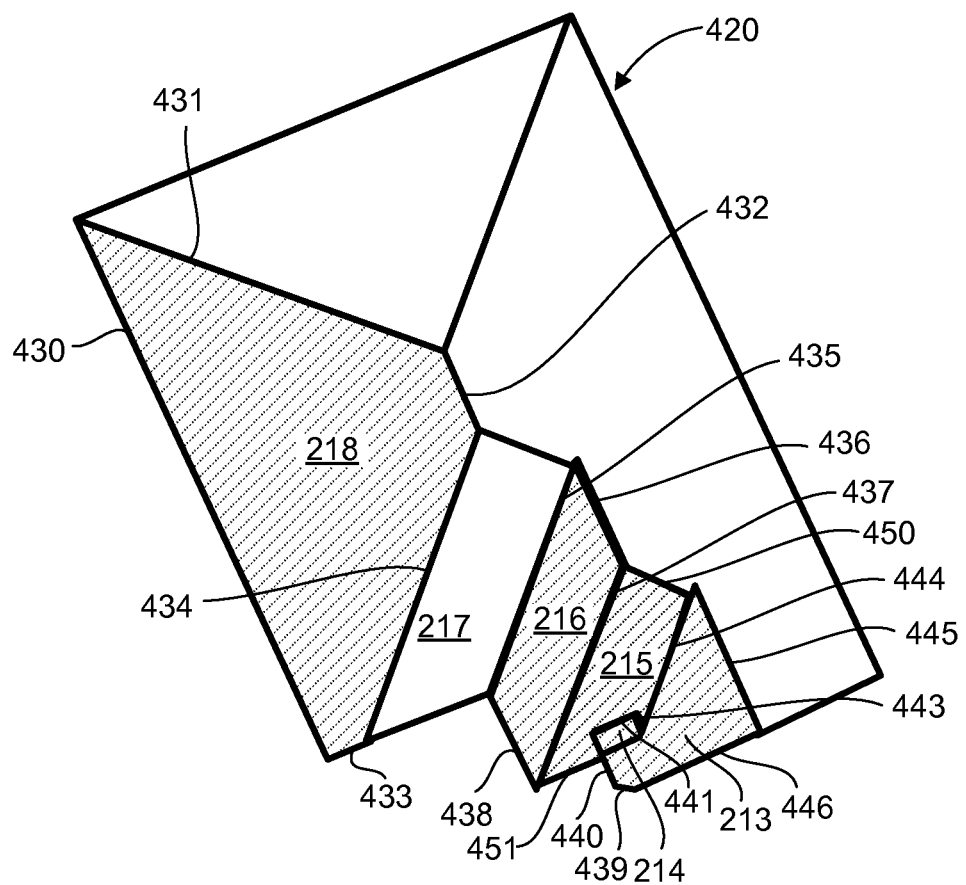

FIGS. 4A and 4B can be used to illustrate reassignment of directionality but also repair indicators. In particular, FIGS. 4A and 4B can represent an example of how a secondary building facet is assigned a repair indicator of a primary building facet based on building facet directionality, sliver detection, a repair indicator, or a combination thereof. Each of building facets 213, including facet portion 214, 216, and 218 can have the same actual directionality. Each of building facets 213, including facet portion 214, 216, and 218 can then be assigned the same "REPLACE" repair indicator. Each of lines 430-446, being associated with building facets 213, 216, and 218 and facet portion 214 can also be assigned a "REPLACE" repair indicator by virtue of being associated with building facets assigned a "REPLACE" repair indicator.

Building facet 215 in CAD image 410 is not assigned a "REPLACE" repair indicator. In CAD image 410 this is indicated by a lack of coding of building facet 215. This can mean building facet 215 of CAD image 410 is not damaged and should not be replaced. Because building facet 215 is linked to a building facet with a directionality that results in a "REPLACE" repair indicator, building facet 215 can have its repair indicator reassigned to "REPLACE" as shown in CAD image 420. For example, if a 200 square foot replacement sliver threshold is set, and building facet 215 has an area of 180 square feet, then building facet 215 and its associated lines 450, 451 can also be reassigned a "REPLACE" repair indicator as shown in CAD image 320. Lines 437, 444, 443, 441, and 440, already associated with building facets assigned a "REPLACE" repair indicator, are already assigned a "REPLACE" repair indicator. Accordingly, determinations of required material quantity, type, replacement cost, and other data related to replacement take into account the additional building facet 215 and its new associated lines 450, 451.

Figure 5:
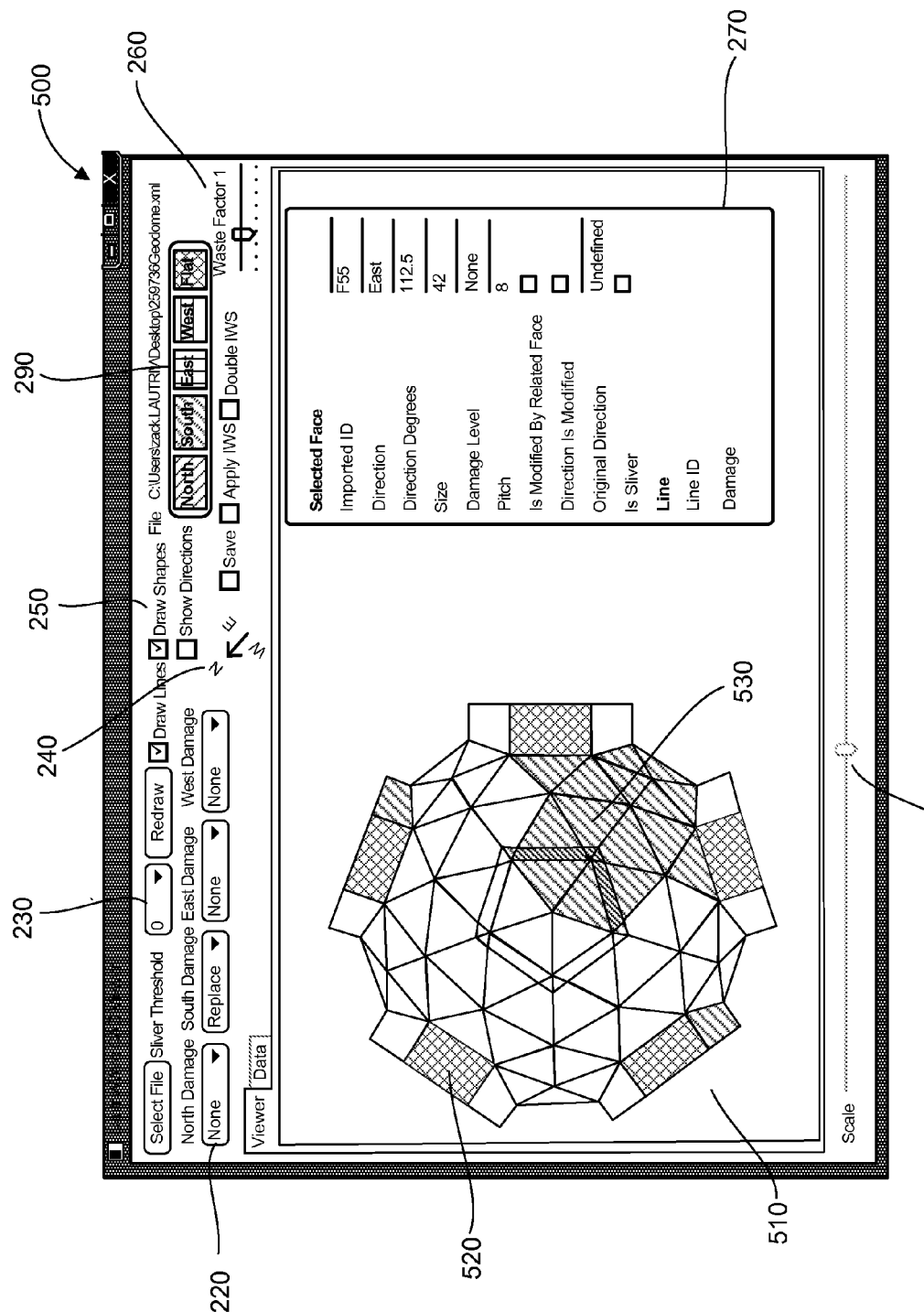

Referring now to FIG. 5, an exemplary embodiment of a portion of the system is shown including CAD image 510. It can be seen that repair indicators 220 are set so that south-facing building facets are assigned to "REPLACE." Accordingly, all of the building facets of CAD image 510 that substantially face south are coded for "REPLACE." Note that actual directionality can be determined by compass indicator 240. It can also be seen that sliver threshold option 230 is set to 0. The embodiment of FIG. 5 allows sliver thresholds set according to square footage of a building facet. Each of the building facets with a directionality setting of South and their associated lines are coded with shading to indicate a "REPLACE" repair indicator.

Figure 6:
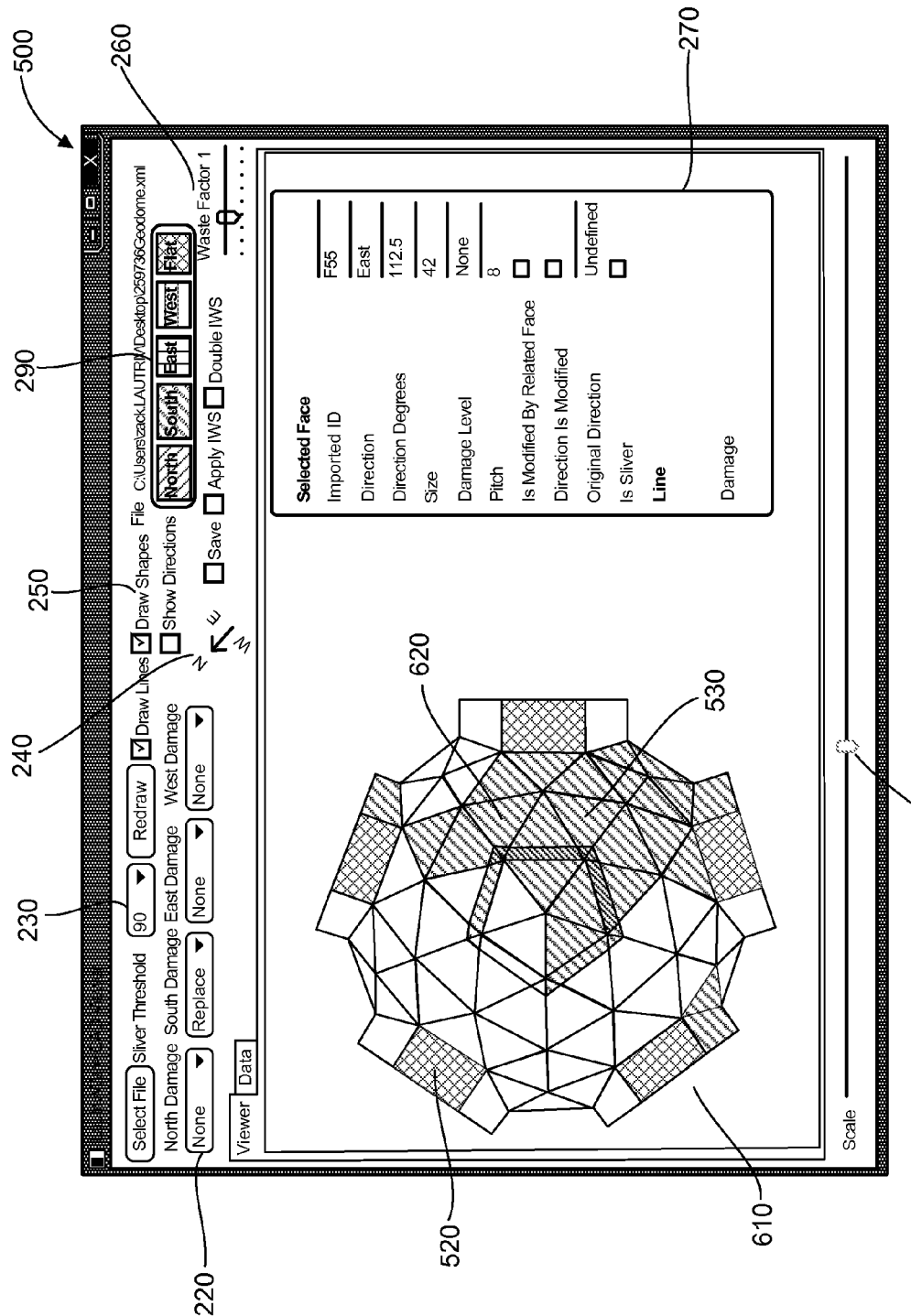

Referring now to FIG. 6, the sliver threshold option 230 is set to 90 square feet. Consequently, each building facet adjacent to a building facet with a directionality of South is assigned a "REPLACE" repair indicators and is coded in the CAD image 610. For example, building facet 620, an east-facing building facet has its repair indicator reassigned to "REPLACE," indicated by recoding it as south-facing. In a preferred embodiment, all building facets are reviewed to determine whether reassignment of the repair indicator is necessary or desirable. In others, a subset of building facets can be reviewed. Additionally, in a preferred embodiment the line types for each building facet is reviewed. Again, in other embodiments, a subset of line types or lines for each building facet or all line types or lines for a subset of building facets can be reviewed. If a line type or line is determined to be a specific line type and the line links building facets that are assigned different directionalities, then the size of each of those building facets can be compared against the sliver threshold set in sliver threshold option 230. In other embodiments other building facet characteristics, as already discussed herein, can be compared. Likewise, a predetermined sliver threshold can be used for comparison.

In a preferred embodiment, if the size of either building facet in a pair of adjacent building facets is below the sliver threshold set in sliver threshold option 230, then the building facet whose size falls below the sliver threshold is reassigned with the directionality of the other building facet. Again, other characteristics can be used for reassignment determinations. For example, in some embodiments, the determination can be based on degrees from normal to the directionality of the adjacent building facet, the length of the outline of the building facet that contacts other building facets already assigned with a repair indicator, size of the building facet, other characteristics, or a combination thereof.

When reassigning the repair indicator, a building facet below the sliver threshold which is linked to a building facet that has a different directionality, now has two or more directionalities (i.e., its original directionality and the directionality of the linked building facet). In a preferred embodiment, building facets assigned with multiple directionalities can act in accordance with any of the assigned directionalities. Furthermore, multi-directional building facets can take on a damage type based on the damage type priority level set in the system. For example, in FIG. 6 is shown building facet 620 that has an original directionality of east and is assigned a directionality of south and is assigned a "REPLACE" repair indicator. The corresponding building facet of FIG. 5 was originally not damaged. However, FIG. 6 illustrates a preferred embodiment in which a sliver threshold is set and building facet 620 acts in accordance with a building facet with a south directionality and, thus, is assigned a "REPLACE" repair indicator.

Figure 7:
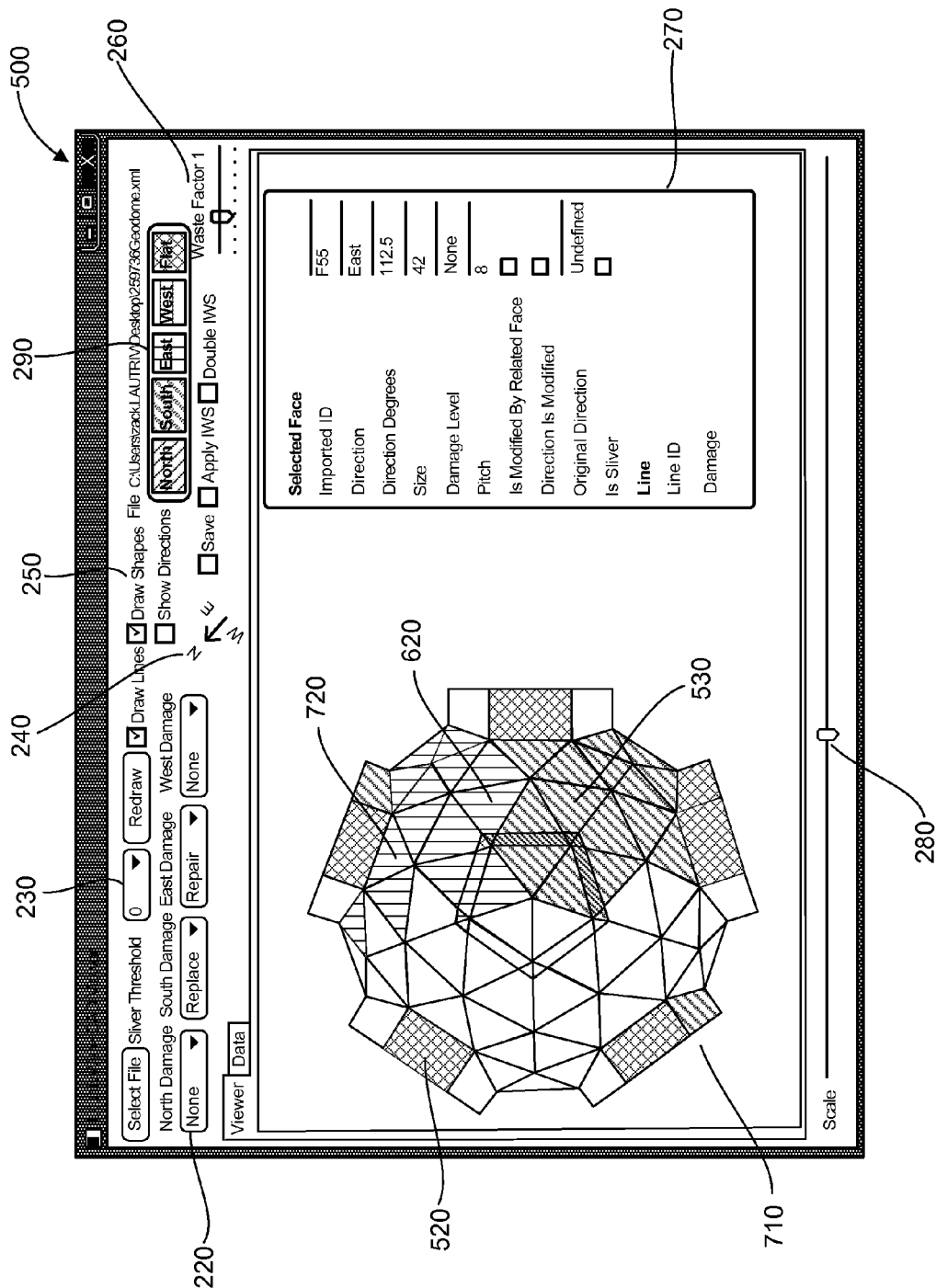

Referring now to FIG. 7, a portion of an exemplary system is shown in which the repair indicator option 220 is set so that building facets with an assigned directionality of south are assigned a "REPLACE" repair indicator and building facets with an assigned directionality of east are assigned a "REPAIR" repair indicator. In the example of FIG. 7, sliver threshold option 230 is set to 0. Consequently, each building facets with a directionality of either south or east is assigned its respective repair indicator according to repair indicator option 220. For example, building facet 620 which substantially faces east is coded to indicate it is assigned a directionality of east and a repair indicator of "REPAIR." Likewise, building facet 720, which also substantially faces east is similarly assigned. Each of the assigned repair indicators is indicated by different coding. For example, building facet 530 is assigned a repair indicator of "REPLACE" and has a different coding than building facets 620 and 720. In the example illustrated in FIG. 7, building facets assigned a repair indicator of "REPLACE" are coded with a backward-diagonal line pattern and building facets assigned a replace setting of "REPAIR" are coded with a vertical line pattern. In other embodiments, coding can be accomplished using other types of coding discussed herein.

Figure 8:
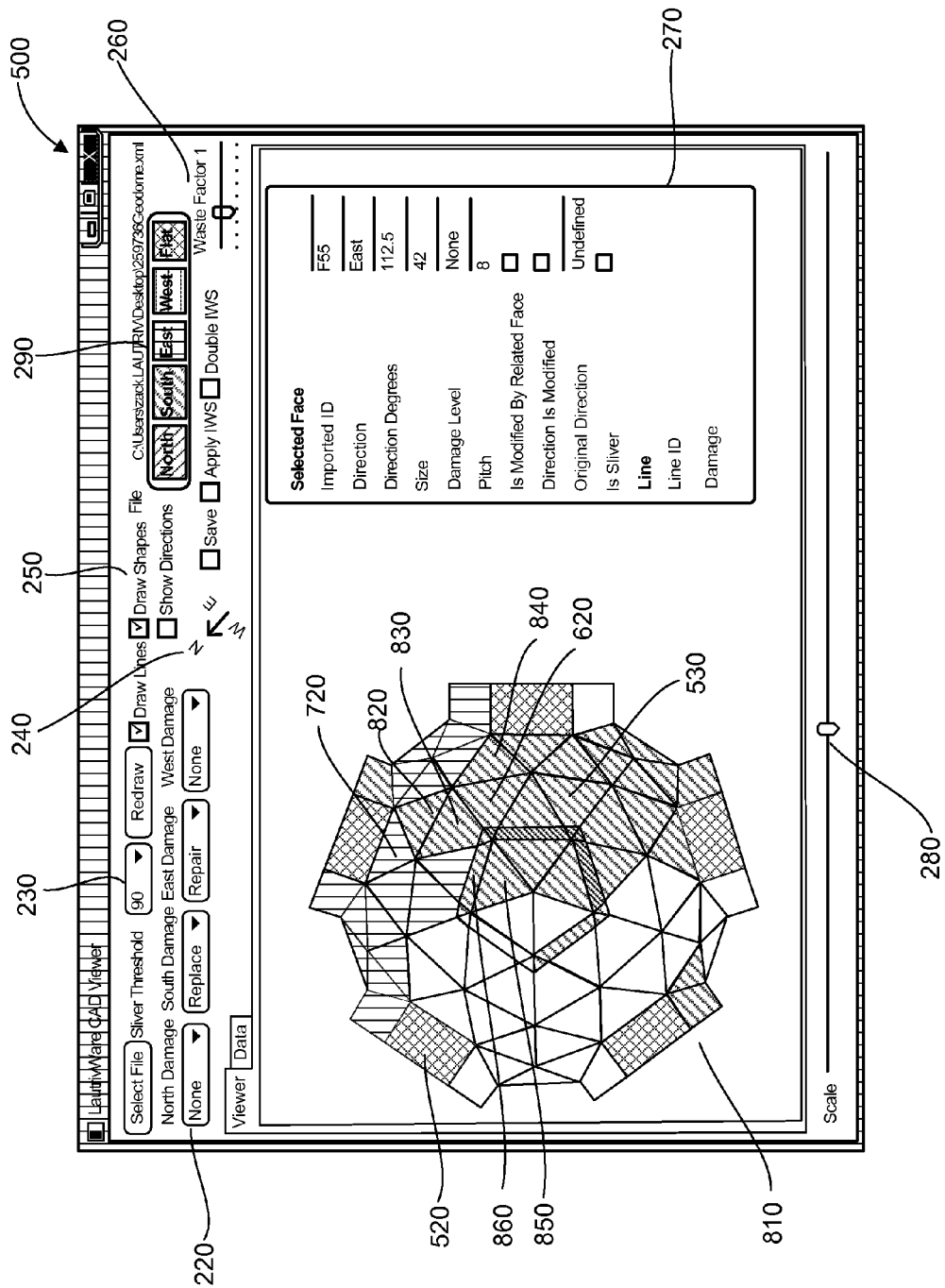

Referring now to FIG. 8, the sliver threshold option 230 is set to 90 square feet. In this example shown, each building facet 820-860 falls below the sliver threshold set in sliver threshold option 230. Consequently, each building facet 820-860 linked to a building facet assigned with a "REPLACE" repair indicator is reassigned a "REPLACE" repair indicator and is coded accordingly. The reassignment of repair indicators of building facets 820-860 can also be based on a repair indicator priority discussed above. Here, the "REPLACE" repair indicator can have a higher priority than "REPAIR." As a result, building facets 820-860 were reassigned a repair indicator rather than other building facets that are adjacent to building facets 820-860.

After building facets and lines are assigned a particular repair indicator, the quantity of building material needed to perform replacements or repair can be determined. This determination can be made using CAD data, including aerial CAD data. Further, the determination can include determining waste quantity. In some embodiments, building material amounts are calculated for all building facets assigned a "REPLACE" repair indicator. In other embodiments, the calculation can be based on a subset of building facets or using other repair indicators. Furthermore, other embodiments may calculate building material amounts for one or more specific building facets. Particular installation procedures for the building facet, building facet line, building material, building material type, or some combination of them can be reviewed to determine a method for calculation.

Figure 9:
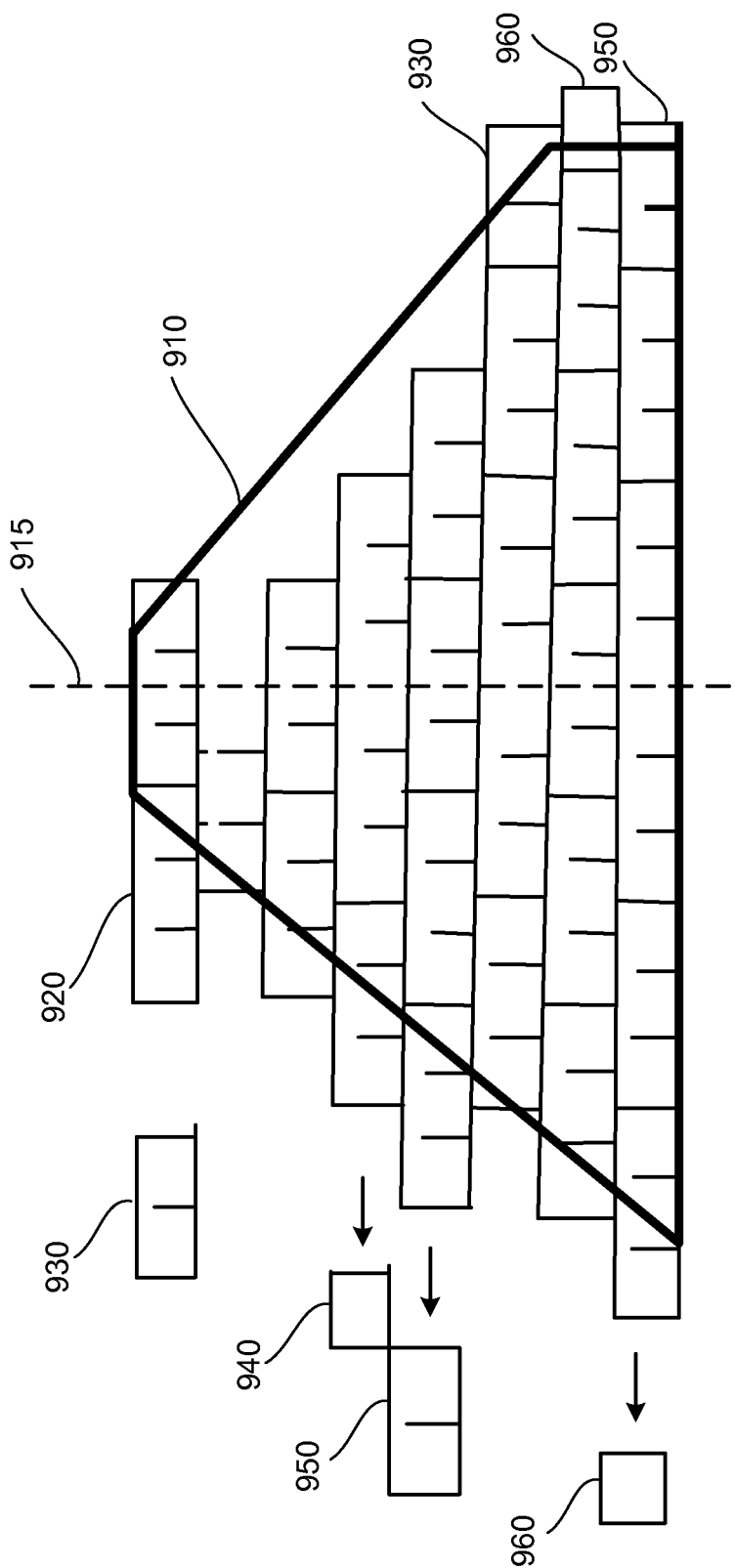
FIG. 9 shows a schematic of a roof facet and a roofing material pattern illustrating a computer-based method for determining material use and reuse requirements and material waste in accordance with an illustrative embodiment of the invention.

In FIG. 9, a schematic of a building facet set for a "REPLACE" repair indicator is shown in which waste material is determined in accordance with an embodiment of the present invention. FIG. 9 illustrates a building material pattern 920 of three tab shingles, which is the most common shingle type. Specifically, roofing material 920 is laid out on a roof facet 910 in a standard fashion from center 915 to left. Excess roofing material is trimmed and placed on the right side of the roof facet 910. Unused portions 930, 950, and 960 are determined to fit spaces on the right side. Any additional excess roofing material trimmings, including unused portion 940, are saved for other facets or ridges. In some embodiments, building material quantity with waste is calculated exactly for all building facets and lines to be replaced. In other embodiments, building material quantity is calculated without waste. In yet other embodiments, calculations are made for a subset of building facets, lines, or both. Those of skill in the art can appreciate that the calculations required for different material types may vary but that the overall method for determining building material amounts does not. Schematics such as roof facet 910 and building material portions 930-960 can be displayed and manipulated via CAD image similar to CAD image 210, 410, 420, 510, 610, 710, 810.

The roofing material pattern 920 includes shingles in rows. Each row is offset from the row above and below it. The height of each row is set to a predetermined height depending on the reveal of the shingle type. The height can also depend on the size and type of the shingles. Shingle placement starts from a center line 915 and shingles are placed both to the right and left of that center line. Shingles are placed to the left of the center line 915 until all of the left side of roof facet 910 in that row is covered by shingles. Shingles are also placed to the right of the center line 915, but the shingles to the right do not get placed if the whole shingle does not fit in the roof facet 910.

The shingles placed on the left side of the roof facet 910 that go outside of the roof facet 910 are cut at the roof facet line and then squared off. In the example illustrated in FIG. 9, if a squared off partial shingle is less than one foot wide, then it is considered waste and it will not be used in the next step of the process. Those of skill in the art understand that limits other than one foot can be appropriate for other shingle types and materials, other roofing types and materials, and other building material types and materials.

The squared off shingles 930-960 that are one foot wide or more are now placed in the rows on the right hand side of the roof facet. Each of unused shingle portions 930, 950, and 960 can be placed in a row on the right hand side. Unused shingle portion 940 is not placed in any row because each of the other rows requires more than a one-foot partial shingle. Accordingly, unused shingle portion 940 can be saved for use on another roof facet, for a ridge cap, or some other building facet or line. When the roofing material placement process is completed for all roof facets assigned a "REPLACE" repair indicator, there will be unused shingle portions left over that can be used as ridge cap material. There will also be some roof facets that are not covered with roofing material on the right hand side. Full shingles are used to complete these rows and any shingle quantity outside of the right hand side of the roof facet is squared off and used for ridge cap material, if they are one foot or more wide.

Returning again to FIG. 4B, shingles can be placed along the eaves that are assigned a "REPLACE" repair indicator. In FIG. 4B, lines 430, 438, and 440 of roof facet CAD image 420 are eave lines. When installing roofing material, a starter strip of shingles is placed on the eaves. One row of shingles is placed along each of these eaves, and the excess shingles are cut and squared off. Any partial shingle less than one foot is discarded as waste. The partial shingles that are one square foot or greater are saved for the ridge cap.

The system then adds up the hip and ridge lines that need to be replaced. In FIG. 4B, the lengths of lines 431, 432, 434, 436, 437, 445, and 450 are summed Single shingle tabs, from three-tab shingles can be placed in an overlapping manner with about five inches of reveal over the hip and ridge lines. For each partially-used shingle from other building facets and lines, it can be determined if the partially-used shingle can be reused. In some embodiments, if a partially-used shingle has a length greater than a tab length but less than two times the tab length, then the partially-used shingle can be considered to have one tab. In other embodiments, the amount of shingle considered reusable can be based on some other predetermined minimum, predetermined maximum, or both. For example, for a three-tab shingle with one-foot tabs, where the partially-used shingle has a length greater than one foot, but less than two feet, then the partially-used shingle is considered to have one tab. If the partially-used shingle is two feet or greater, then the shingle is considered to have two tabs.

The number of tabs required for the roof line, can be determined by dividing the aggregate length of the roof lines to be replaced by the reveal on those lines. For example, for the roof facet CAD image 420 in FIG. 4B, the sum length of hip and ridge lines 431, 432, 434, 436, 437, 445, and 450 is divided by five inches, which is the reveal for three-tab shingles with one-foot tabs, to determine the number of tabs needed to cover those lines 431, 432, 434, 436, 437, 445, and 450. The number of tabs generated from the partially-used shingles is subtracted from the quantity of tabs needed to cover the hip and ridge lines 431, 432, 434, 436, 437, 445, and 450. The number of additional whole shingles can then be calculated to cover the remainder of the hip and ridge lines 431, 432, 434, 436, 437, 445, and 450. For the roof facet CAD image 420 of FIG. 4B, each shingle has three tabs; therefore the number of additional tabs needed to cover the hip and ridge lines 431, 432, 434, 436, 437, 445, and 450 is divided by three. This number can then be rounded up to the nearest whole number. Those of skill in the art can understand that depending on the type of shingles used, the determination of tabs required for roof facet lines can change. For example, if the roof material required is a four-tab shingle, the number of additional tabs needed would be divided by four.

In another embodiment, the quantity of building material can be determined by virtualizing the piece-by-piece installation procedure on the building facet or building facet line. For example, referring back to FIG. 4B, building facet line 430, which is an eave line, can be tagged with a "REPLACE" repair indicator. Building facet line 430 further can be tagged with building materials drip edge, ice and water shield, gutter, soffit, and the like. In this example, drip edge material lengths can be laid out on CAD image 420 in to-scale eight-foot-long pieces and trimmed at the end of the line. A left over trimmed piece of drip edge can be installed on other building facet lines tagged with building material drip edge to avoid waste. When building facet line materials are reused can depend on minimum required installation length based on installation procedures or requirements for the building material, building material type, building code requirements, and the like.

Figure 10:
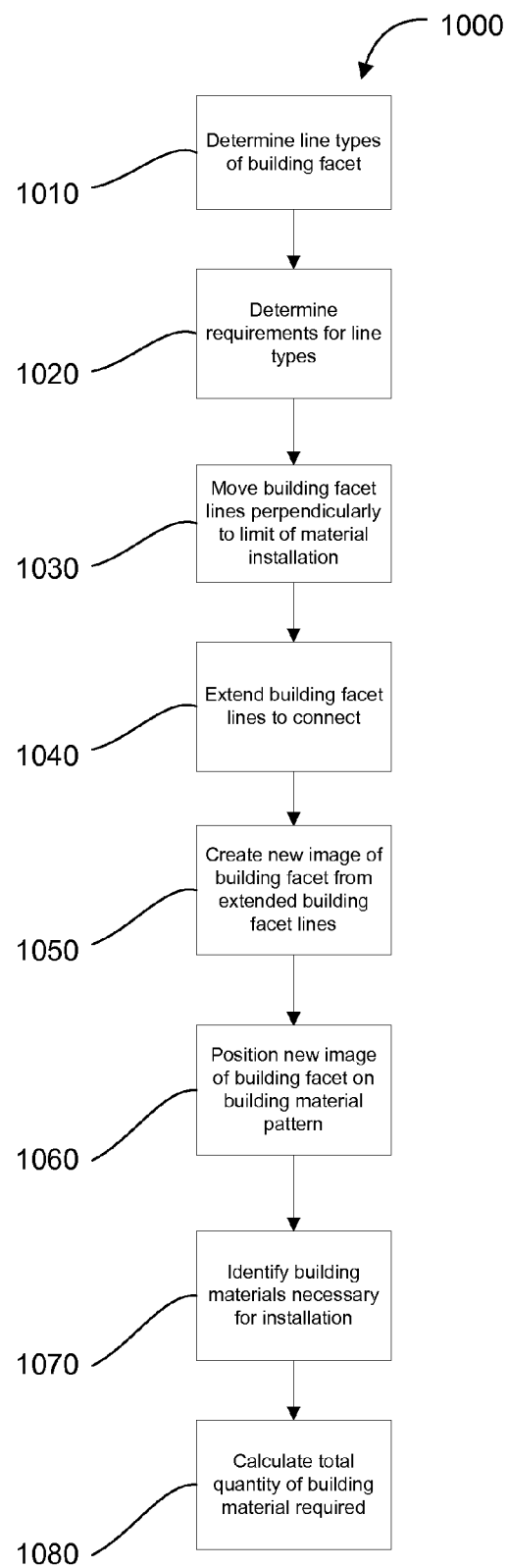
FIG. 10 shows a flowchart of a method for determining the amount of building materials required for installation for the replacement of a building facet in accordance with an illustrative embodiment of the invention.

Referring now to FIG. 10, a method for determining required building materials 1000 in accordance with a preferred embodiment is shown. In some embodiments the calculated material installation quantities are actual quantities with waste amounts. In other embodiments, waste amounts can be omitted. Although the embodiment shown in FIG. 10 illustrates a particular order for blocks 1010-1080, the order illustrated in the flowchart is by way of example only and the blocks and/or steps within blocks do not have to be executed in a particular order or at a particular time. In some embodiments, blocks 1010-1080 or a subset thereof can be performed iteratively to refine the calculated material installation quantities.

In a preferred embodiment, a building materials database 132 is maintained as discussed above. The determination of material quantity can be based on the area of the building facet and building materials data 132 related to the particular building material required for replacement. Such building material data can include the type of building material, and the size of the building material unit. In particular for roofing building facets, a preferred embodiment considers roofing materials length, width, installation exposure, installation course offset, and installation rules for each roof facet line type in the building materials database 132.

Figure 11A:
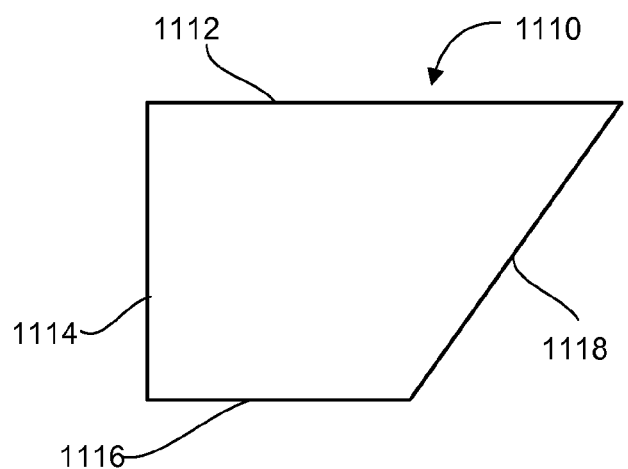
FIGS. 11A-E show schematics of a roof facet's lines adjusted to create a facet area to determine the amount of building materials required for installation for the replacement of the roof facet in accordance with an illustrative embodiment of the invention.

The line types of the building facet are determined 1010. For example, FIG. 11A illustrates a building facet assigned to be replaced and that includes a ridge line 1112, a rake 1114, an eave 1116, and a valley 1118. In accordance with the embodiment illustrated in FIG. 10, each of those line types would be identified.

The surface area installation requirements for each line type are determined 1020. The determination of material quantity can be based on a building facet's line types to see if there are any building material installation rules based on the building material type being installed on the building facet. Such installation rules can include material installation best practices, material manufacturer's required installation procedures, its recommended installation procedures, or a combination thereof. In some embodiments installation rules can be obtained directly from a material manufacturer database 160 via a communications link. In other embodiments, installation rules can be stored locally, such as in storage medium 130 or building materials database 132.

Depending on the line type and the building material type, installation may require that the building material be installed prior to, at, or past a building facet line. In order to calculate the building material needed for installation on a building facet, an exemplary system, in accordance with a preferred embodiment of the present invention can adjust the size of the building facet by moving or extending the building facet's lines so that the true roofing material installation area is represented.

Figure 11B:
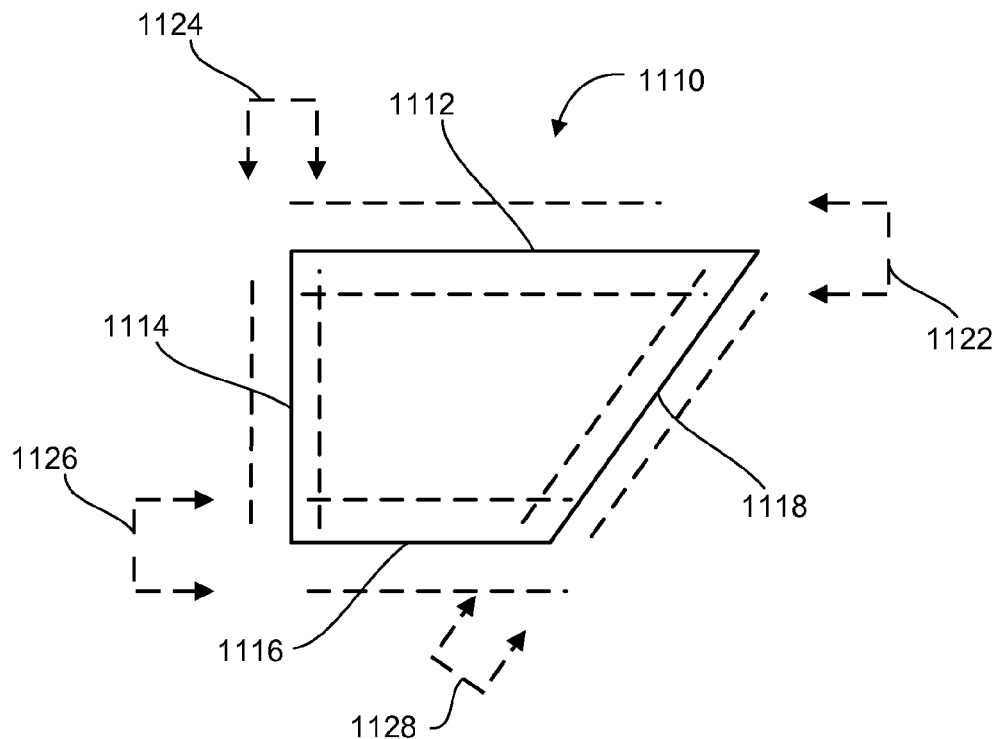

The building facet lines are moved perpendicularly 1030. The extent of the movement of each line represents where building material should be installed to. For example, in FIG. 11B is shown an illustration of the potential extent of each of lines 1112-1118 associated with a roof facet 1110. Ridge line 1112 can be extended perpendicularly a distance 1122 in either direction from its original position. Similarly, rake line 1114 can be extended a distance 1124, eave line 1116 can be extended a distance 1126, and valley line 1118 can be extended a distance 1128. Depending on the roof facet line type and the roofing material installation rules, a roof facet line may be moved outward or inward to the point of roofing material installation.

Figure 11C:
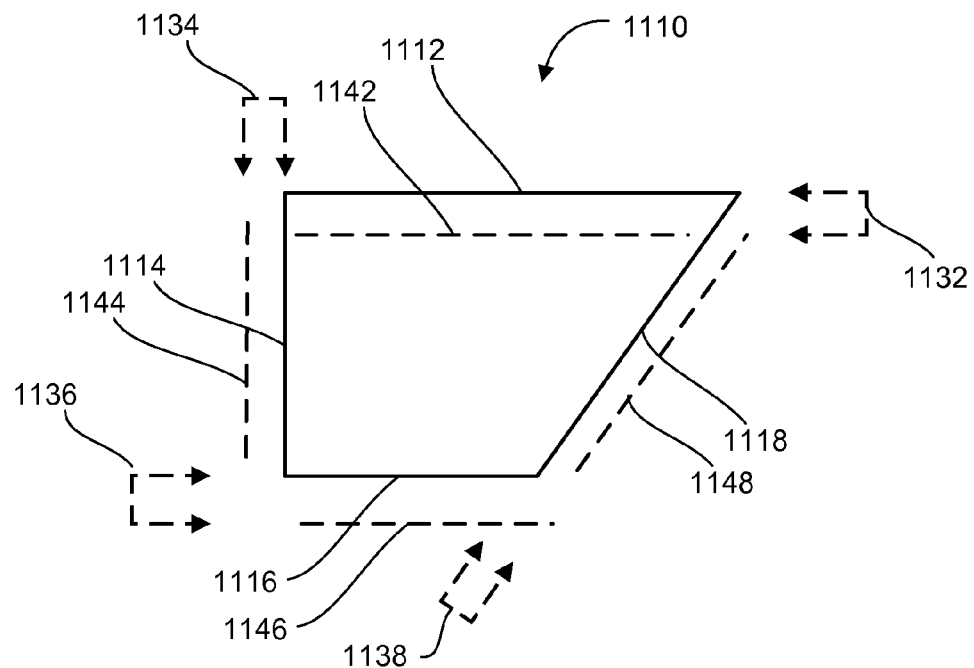

Specifically, as shown in FIG. 11C, the eave line 1116 requires that roofing material extend a three-inch distance 1136 past the eave line 1116 and is moved to eave line 1146. The rake line 1114 requires that roofing material extend a two-inch distance 1134 past the rake line 1114 and is moved to rake line 1144. The ridge line 1112 requires that roofing material installation stop a six-inch distance 1132 before the ridge line 1112 and is moved to ridge line 1142. And the valley line 1118 requires that roofing material be installed a twelve-inch distance 1138 past the valley line 1118 and is moved to valley line 1148.

Figure 11D:
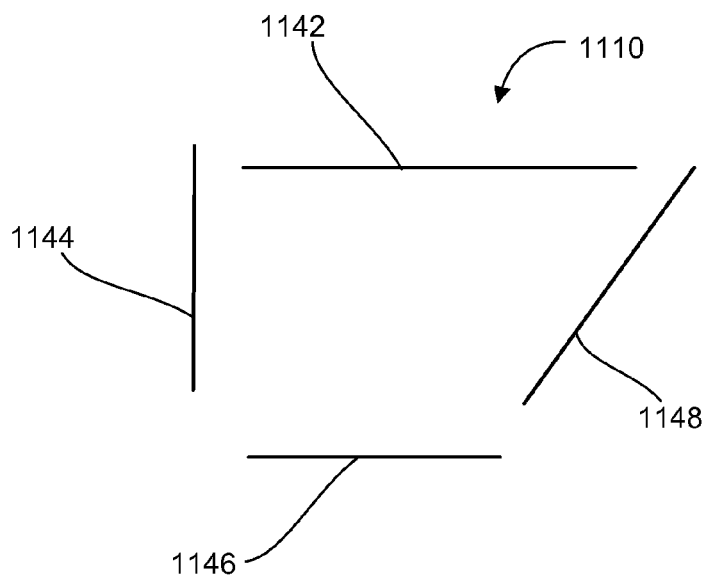
Figure 11E:
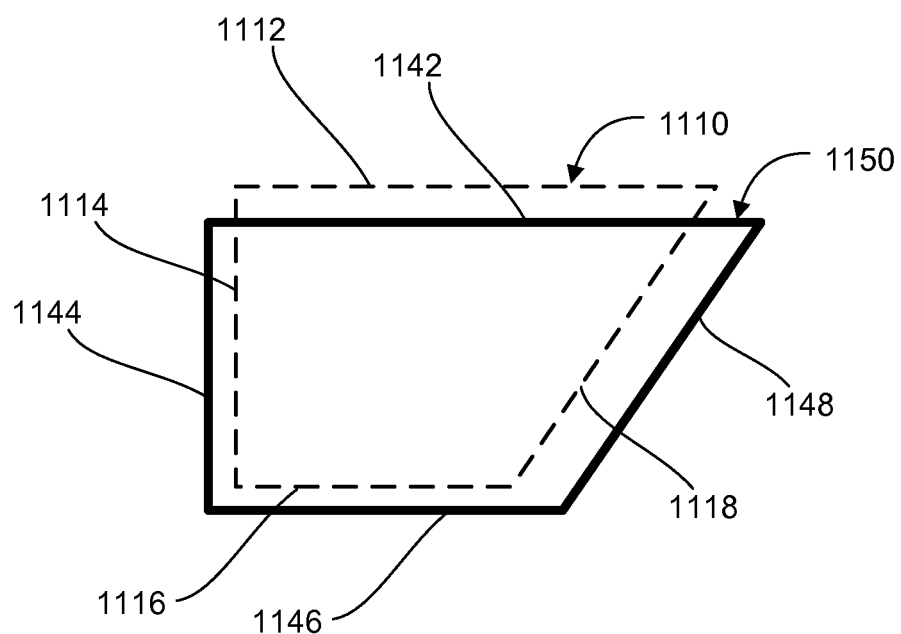

Each building facet line is then extended 1040 so that the lines are connected. Each line can be extended either outward to reach a connecting line that has been moved out or extended inward to reach a connecting line that has been moved in. For example, FIG. 11D illustrates the new position of moved lines 1142-1148. A new building facet image is created 1150 from the extended building facet lines. FIG. 11E illustrates a new building facet image 1150 adjusted for the roofing material installation requirements.

Figure 12:
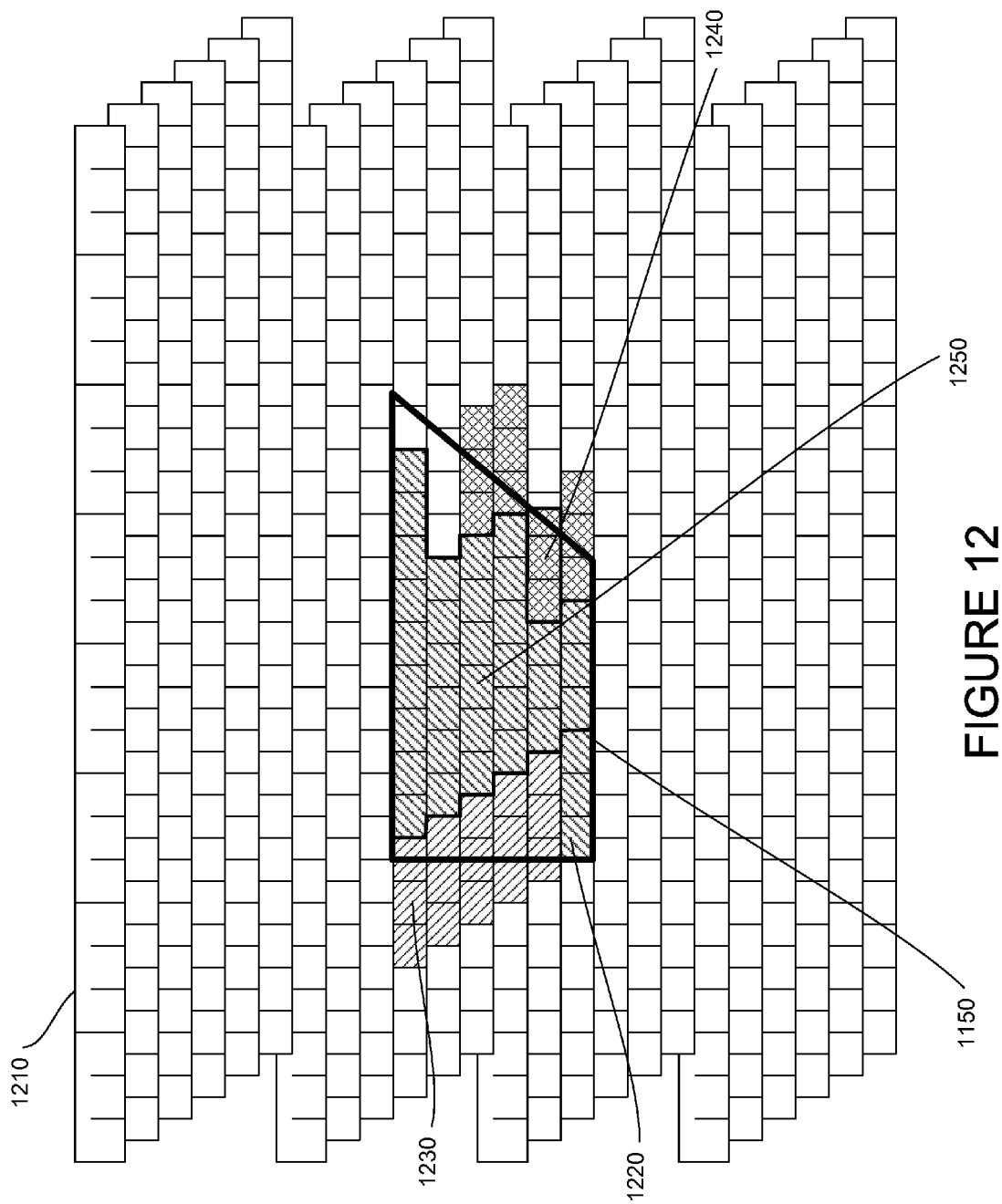
FIG. 12 shows a schematic of the roof facet from FIGS. 11A-E superimposed on a shingle pattern for determining shingle use and reuse requirements and shingle waste in accordance with an illustrative embodiment of the invention.

The new building facet image is positioned on a building material pattern 1060. As an example, in FIG. 12 is shown a roofing material pattern 1210 based on the roofing material to be installed on the roof facet 1150. In this step, a preferred embodiment will include determining the building material's width, length, exposure, and each installation course's offset. Using that information, a building material pattern is created. The example shown in FIG. 12 is based on a typical three tab shingle with a length of 36 inches, a width of 12 inches, an offset of 6 inches, and an exposure of 5.5 inches. Building material patterns for other shingle types, roofing types, or other building material types can be created. For example, a building material pattern can be created and used for siding material.

Returning to FIG. 10, as part of positioning the building facet image on the building material pattern 1060, the building facet is first oriented on the building material pattern so that the building facet and the building material pattern are vertically aligned. For example, in FIG. 12, the roof facet 1150 is positioned so that its downward slope points down and is perpendicular with the horizontal roofing material courses of roofing material pattern 1210.

As part of positioning the building facet image on the building material pattern 1060, the building facet can be lined up vertically with a particular piece of building material in the pattern so that the building facet's bottom-most point is placed on the bottom horizontal line of building material. For example, as shown in FIG. 12, roof facet 1150 is lined up with shingle 1220 at the bottom of each.

Also as part of positioning the building facet image on the building material pattern 1060, a determination of how to position the building facet horizontally is made. In some embodiments, a building facet may be positioned to line up with the left side of building material, the right side of building material, centered with building material, or offset by some predetermined distance from a predetermine point in the building material. For left alignment of the building facet, the building facet is moved horizontally so that the building facet's left most point within the exposed area of the selected building material's course is lined up with the left most vertical line of the selected building material. In this example, the building facet has multiple left-most roof facet points within the exposed area of the selected building material's course because the left-most points are part of a vertical rake line. In FIG. 12, it is shown an example of the left alignment in that the left side of roof facet 1150 is aligned with the left side of shingle 1220.

In other embodiments, for a right alignment, a building facet is moved horizontally so that the building facet's right-most point within the exposed area of the selected building material's course is lined up with the right-most vertical line of the selected building material. In yet other embodiments, for a center alignment, a building facet is moved horizontally so that the building facet's bottom-most point vertically lines up with the selected building material's center vertical line. If the building facet has multiple bottom-most points (e.g., a horizontal line for example), then the center point between the bottom-most points is lined up with the selected building material's center vertical line.

The building materials necessary for installation are identified 1070. As part of this step, the building material that is fully within the building facet is identified. For example, FIG. 12 illustrates the roofing material 1250 that lies within the roof facet 1150. Also, partially-used building materials that have right sides within the building facet, but left sides outside of the building facet. For example shingle 1230 of FIG. 12 is one such partially-use building material. Partially-used shingles can be seen as shingles with backward line hatching in roofing material pattern 1210.

Each partially-used building material piece with the right side within the facet is reviewed. The aggregate area of those partially-used building material pieces that lies within the building facet is calculated. For example, in FIG. 12, shingle 1230 includes one half of one tab that lies within roof facet 1150. That one half of one tab is included in the aggregate area. The portion of the building material piece that lies outside of the building facet can be reused. Whether that portion can be reused can depend on a minimum building material size requirement for partial building material to be used. Such minimum building material size requirements can be included in the building material database 132 or be received from the building material manufacturer. If the size of the unused portion of the building material piece does not meet the minimum building material size requirement to be reused, the unused portion of the partially-used building material piece is not reused. The size requirement can be based on area, height, length, or some combination thereof.

The unused portions of the partially-used building material pieces that are determine to be reusable are then analyzed for placement to the right of the building material that lies entirely within the building facet. It should be understood that building partially-used building material can be analyzed for reuse from any side of the facet, including the left, right, top, or bottom. Those of skill in the art can appreciate that the analysis can depend on the type of building facet, the types of lines associated with the building facet to be replaced, the type of building material, the sizes of the building material or building facet, the relative sizes of the building material and building facet, some other characteristic of the building material or building facet, or some combination thereof. In some embodiments, unused portions of building materials can be determined to be used for other purposes. For example, unused portions of shingles or other roofing material can be used for installation on roof ridges.

In FIG. 12 is shown an example of reused partially-used building material. Specifically, shingle portion 1240 represents the unused portion of shingle 1230 that is determined to meet the minimum building size requirement for reuse and is determined to ideally fit in the shingle course just above the bottom shingle course. Other reused portions of partially-used shingles can be seen as cross-hatch in roofing material pattern 1210.

As part of identifying building materials necessary for installation 1070, additional building materials necessary to complete replacement of the building facet, are identified. In this case, whole building material pieces are used. Furthermore, any unused portions of those whole building material pieces can then be determined to be reused by iterating through sub-steps of identifying building materials necessary for installation.

Returning to FIG. 10, at 1080 the total quantity of building material required for installation is calculated. The installation area of each building facet as adjusted or not for building material installation is calculated and summed. In some embodiments, the waste amount, that is the unused portions of building roofing material areas, is also calculated and summed.

Figure 13:
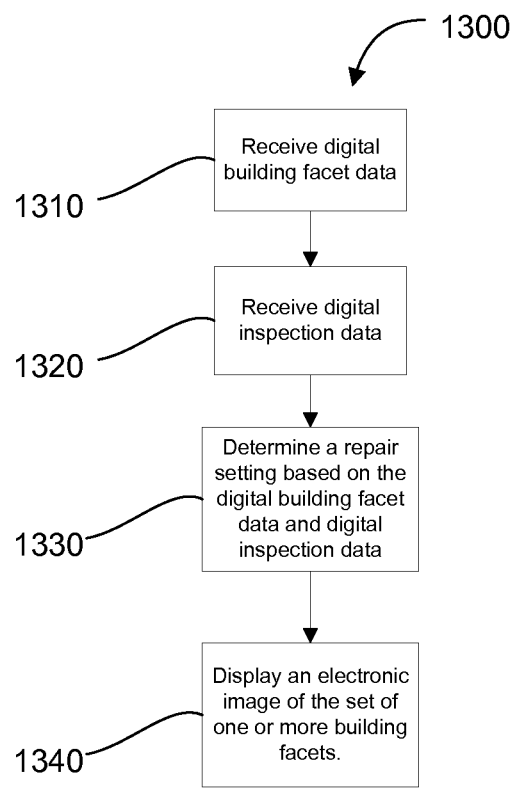
FIG. 13 shows a flowchart of a method for determining building material requirements for a repair or replacement based on building facet data, inspection data, and guideline data in accordance with an illustrative embodiment of the invention.

In FIG. 13 is shown a flowchart of a method for determining building material requirements 1300. The method includes a step for receiving digital building facet data 1310. Digital building facet data can be received from an aerial CAD data provider. In other embodiments, building facet data can be received from other CAD data or another source that can provide dimensional data concerning building facets. In yet other embodiments, building facet data can be received from a user via an input device. Digital facet data can be received from two or more sources. For example, a user can enter dimensions, line types, slope, and other building facet characteristics.

At 1320, digital inspection data is received. Digital inspection data can include data gathered at the property site from an inspector or adjuster. It can also include data related to the weather conditions that caused damage to the property. Like digital building facet data can be received from one or more different providers or sources. Digital data received at steps 1310 and 1320 can be received via a network communications interface 110 or through some other input device 115. Furthermore, data received at steps 1310 and 1320 can be stored in volatile or non-volatile memory, for example in memory 135 or in storage medium 130.

At step 1330, a repair indicator is determined based on the digital building facet data and digital inspection data or as described elsewhere herein. An electronic image of the set of one or more building facets is displayed 1340. The display can be presented on display 120 or some other output peripheral of computer 100. For example, a display can be output to a printer. Moreover, in another embodiment, a display image can be sent to another device, such as a portable device 170. The displayed image can be made in color, grayscale, black and white, or some other display scheme. Further, the display can include coding of a sort as described herein.

Figure 14:
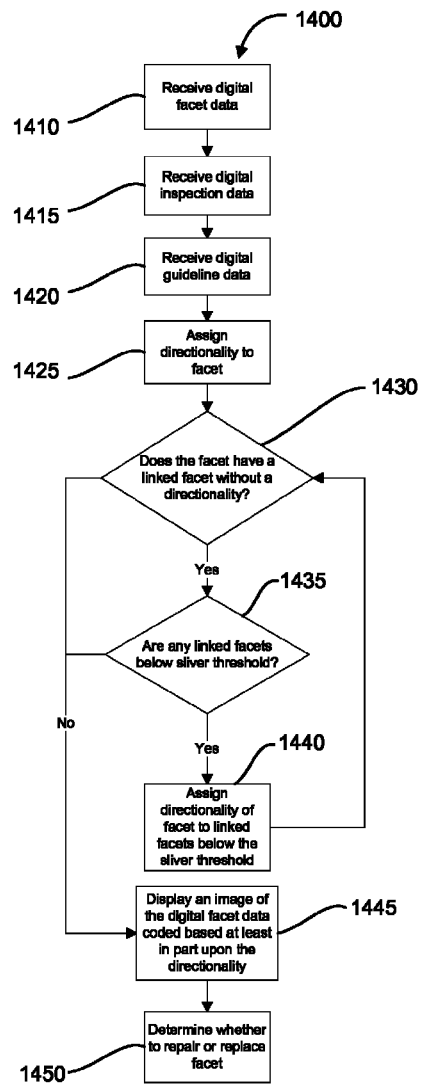
FIG. 14 shows a flowchart of a method for a repair vs. replacement analysis in accordance with an illustrative embodiment of the invention.

Referring now to FIG. 14, a flowchart of a method for a repair vs. replacement analysis 1400 is shown. Digital facet data is received 1410 and digital inspection data is received 1415. At step 1420, guideline data is received. Using the received data, directionality is assigned to a building facet 1425. In one embodiment, directionality can be assigned to every building facet and building facet line that for which building facet data is received. In other embodiments, directionality can be assigned to a subset of building facets or a subset of the building facet's associated lines. For example, directionality can be assigned to only those facets and lines for which inspection data is received or to only those facets and lines that are of interest to a user.

At step 1430, facets linked to the building facet are checked for directionality. If a linked facet lacks an assigned directionality and is determined to be below a sliver threshold 1435, the linked facet is assigned the same directionality as the building facet to which it is linked 1440. In some embodiments, iteration through every building facet and its associated lines and linked facets can be performed to ensure that directionality is properly assigned to all facets and lines so that a complete repair vs. replace decision can be made. In some embodiments, only a subset of facets and/or lines can be subject to the single analysis or analysis iteration.

An image of the digital facet data coded based at least in part upon directionality is displayed 1445 and a determination of whether to repair or replace the building facet is made 1450. As describe above, the determination of a repair, replace, or other setting can be made initially based on the received data. Subsequently, the settings can be reassigned based on other predetermined rules or other received data, such as insurance guidelines or building codes or based on user decision.

In conclusion, the present invention provides, among other things, a system and method for intelligently setting building facet directionality and estimating a quantity of building material with waste associated with a building facet repair, replacement, or both. Additionally, it provides a system and method for using aerial CAD data, insurance and building code guidelines, weather data, and inspection data for intelligently making repair decisions for building facets. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method for property repair analysis comprising:
   receiving digital building facet data for a first building facet of a set of one or more building facets;
   receiving digital inspection data for the first building facet;
   determining an amount of building material required to repair damage to an area of the first building facet, including determining a first amount of waste building material;
   determining a repair indicator for the first building facet; wherein the determining a repair indicator is based at least in part upon the digital facet data for the first building facet and the inspection data for the first building facet; and
   displaying an electronic image of the set of one or more building facets.

2. The method of claim 1 wherein the building facet data for the first building facet comprises aerial computer-aided design data for constructing a computer-aided design image of the first building facet.

3. The method of claim 1 wherein the building facet data for the first building facet comprises data from the group consisting of building facet points, building facet edge lines, building facet line type, building facet type, building facet degrees, building facet pitch, and building facet area.

4. The method of claim 1 wherein the inspection data for the first building facet comprises data from the group consisting of damage type, hail hit frequency, wind damage data, building material, building material type, and building facet material age.

5. The method of claim 1 wherein the determining a repair indicator for the first building facet is further based at least upon a guideline type selected from the group consisting of building code guidelines and insurance carrier guidelines.

6. The method of claim 1, further comprising:
   receiving physical weather data related to an event that caused the damage;
   wherein the determining a repair indicator for the first building facet is further based at least upon the physical weather data.

7. The method of claim 1 further comprising:
   assigning a first directionality to the first building facet;
   wherein the determining a repair indicator for the first building facet is further based at least upon the first directionality.

8. The method claim of 7, further comprising:
   receiving digital building facet data for a second building facet of the set of one or more building facets; wherein the second building facet is linked to the first building facet;
   receiving digital inspection data for the second building facet;
   determining an amount of building material required to repair damage to an area of the second building facet, including determining a second amount of waste building material;
   assigning a second directionality to the second building facet; and
   determining a repair indicator for the second building facet; wherein the determining a repair indicator for the second building facet is based at least in part upon the digital facet data for the second building facet, the inspection data for the second building facet, and the second directionality.

9. The method of claim 8 wherein the assigning the second directionality comprises setting the second directionality to equal the first directionality when a predetermined geometric value of the second building facet is below a predetermined sliver threshold.

10. The method of claim 1 wherein the displaying an electronic image of the set of one or more building facets includes displaying a representation of the repair indicator for the first building facet.

11. The method of claim 1 further comprising:
changing the repair indicator for the first building facet based at least in part upon a user input.

12. A non-transitory computer-readable storage medium containing a plurality of program instructions executable by a processor for property repair analysis, the plurality of program instructions comprising;
a first instruction set configured to receive digital building facet data for a first building facet of a set of one or more building facets;
a second instruction set configured to receive digital inspection data for the first building facet;
a third instruction set configured to determine an amount of building material required to repair a damaged area of the first building facet, including to determine a first amount of waste building material;
a fourth instruction set configured to determine, based at least in part upon the digital facet data for the first building facet and the inspection data for the first building facet, a repair indicator for the first building facet; and
a fifth instruction set configured to display an electronic image of the set of one or more building facets.

13. The non-transitory computer-readable medium of claim 12 wherein the building facet data comprises aerial computer-aided design data for constructing a computer-aided design image of the first building facet.

14. The non-transitory computer-readable medium of claim 12 wherein the building facet data for the first building facet comprises data from the group consisting of building facet points, building facet edge lines, building facet line type, building facet type, building facet degrees, building facet pitch, and building facet area.

15. The non-transitory computer-readable medium of claim 12 wherein the inspection data for the first building facet comprises data from the group consisting of damage type, hail hit frequency, wind damage data, building material, building material type, and building facet material age.

16. The non-transitory computer-readable medium of claim 12 wherein the fourth instruction set is further configured to determine the repair indicator for the first building facet based at least upon on a guideline type selected from the group consisting of building code guidelines and insurance carrier guidelines.

17. The non-transitory computer-readable medium of claim 12, further comprising:
a sixth instruction set configured to receive physical weather data related to an event that caused the damage;
wherein the determination of a repair indicator for the first building facet is further based at least upon the physical weather data.

18. The non-transitory computer-readable medium of claim 12 further comprising:
a seventh instruction set configured to assign a first directionality to the first building facet;
wherein the determination of a repair indicator for the first building facet is further based at least upon the first directionality.

19. The non-transitory computer-readable medium claim of 18, further comprising:

an eighth instruction set configured to assign a second directionality to a second building facet of the set of one or more building facets, wherein the second building facet is linked to the first building facet;
a ninth instruction set configured to receive digital building facet data for a second building facet of the set of one or more building facets; wherein the second building facet is linked to the first building facet;
a tenth instruction set configured to receive digital inspection data for the second building facet;
an eleventh instruction set configured to determine an amount of building material required to repair damage to an area of the second building facet, including to determine a second amount of waste building material;
a twelfth instruction set configured to assign a second directionality to the second building facet; and
a thirteenth instruction set configured to determine a repair indicator for the second building facet; wherein the determination of a repair indicator for the second building facet is based at least in part upon the digital facet data for the second building facet, the inspection data for the second building facet, and the second directionality.

20. The non-transitory computer-readable medium of claim 19 wherein the eighth instruction set is further configured to set the second directionality equal the first directionality when a predetermined geometric value of the second building facet is below a predetermined sliver threshold.

21. The non-transitory computer-readable medium of claim 12 wherein the fifth instruction set includes displaying a representation of the repair indicator for the first building facet.

22. The non-transitory computer-readable medium of claim 12 further comprising:
a fourteenth instruction set configured to change the repair indicator for the first building facet based at least in part upon a user input.

23. A system for property repair analysis, comprising:
at least one computer processor;
a communications network interface with which to receive digital data; and
a memory containing a plurality of program instructions configured to cause the at least one processor to:
receive digital building facet data for a first building facet of a set of one or more building facets;
receive digital inspection data for the first building facet;
determine an amount of building material required to repair damage to an area of the first building facet, including determining an amount of waste building material;
assign a directionality to the first building facet;
determine a repair indicator for the first building facet; wherein the determination of a repair indicator is based at least in part upon the digital facet data and the inspection data; and
display an electronic image of the set of one or more building facets and a representation of a the repair indicator.

* * * * *